US009654129B2

(12) United States Patent
Sasaki et al.

(10) Patent No.: US 9,654,129 B2
(45) Date of Patent: May 16, 2017

(54) SIGNAL PROCESSING DEVICE

(71) Applicant: Asahi Kasei Kabushiki Kaisha, Osaka (JP)

(72) Inventors: Hiroyuki Sasaki, Tokyo (JP); Masaya Yamashita, Tokyo (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 6 days.

(21) Appl. No.: 14/708,802

(22) Filed: May 11, 2015

(65) Prior Publication Data

US 2015/0241524 A1 Aug. 27, 2015

Related U.S. Application Data

(63) Continuation of application No. 14/374,339, filed as application No. PCT/JP2013/000405 on Jan. 25, 2013, now Pat. No. 9,148,158.

(30) Foreign Application Priority Data

Feb. 3, 2012 (JP) .................................. 2012-021957
Mar. 12, 2012 (JP) .................................. 2012-054967
(Continued)

(51) Int. Cl.
*H03M 1/06* (2006.01)
*H03M 1/12* (2006.01)
(Continued)

(52) U.S. Cl.
CPC .......... *H03M 1/0634* (2013.01); *G01D 3/028* (2013.01); *G01R 33/0029* (2013.01);
(Continued)

(58) Field of Classification Search
None
See application file for complete search history.

(56) References Cited

U.S. PATENT DOCUMENTS 4,580,234 A 4/1986 Fujita
4,651,130 A 3/1987 Pennell
(Continued)

FOREIGN PATENT DOCUMENTS

JP 07-218288 A 8/1995
JP 2002-071381 A 3/2002
(Continued)

OTHER PUBLICATIONS

Extended European Search Report dated Apr. 18, 2016, in corresponding EP Patent Application No. 16150173.9.
(Continued)

*Primary Examiner* — Howard Williams
(74) *Attorney, Agent, or Firm* — Morgan, Lewis & Bockius LLP

(57) ABSTRACT

There is provided a signal processing device comprising a combination unit (3) configured to combine plural element signals based on plural physical quantity signals including signal components in accordance with desired physical quantities, respectively, by the number of times equal to or greater than a number of the plural physical quantity signals, and to output combined signals different from each other; a measuring unit (4) configured to sequentially receive the combined signals output from the combination unit (3); and a computing unit (5) configured to compute signal components based on the desired physical quantities from signals that are generated based on the combined signals sequentially output from the measuring unit.

10 Claims, 20 Drawing Sheets

(30) Foreign Application Priority Data

Mar. 30, 2012 (JP) ................................ 2012-081433
Apr. 26, 2012 (JP) ................................ 2012-101156

(51) Int. Cl.
- *H03M 1/00* (2006.01)
- *H03M 1/08* (2006.01)
- *G01D 3/028* (2006.01)
- *G01R 33/00* (2006.01)

(52) U.S. Cl.
CPC ......... *H03M 1/002* (2013.01); *H03M 1/0863* (2013.01); *H03M 1/1245* (2013.01)

(56) References Cited

U.S. PATENT DOCUMENTS

| | | |
|---|---|---|
| 5,677,686 A | 10/1997 | Kachi et al. |
| 6,201,480 B1 | 3/2001 | Aoki |
| 8,032,326 B2* | 10/2011 | Handa .............. G01C 9/00 702/153 |
| 8,150,657 B2 | 4/2012 | Yamashita et al. |
| 2002/0021124 A1 | 2/2002 | Schott et al. |
| 2009/0271142 A1* | 10/2009 | Yamashita ......... G01D 3/028 702/141 |

FOREIGN PATENT DOCUMENTS

| | | |
|---|---|---|
| JP | 2009-25208 A | 2/2009 |
| WO | 2008/032741 A1 | 3/2008 |

OTHER PUBLICATIONS

International Search Report and Written Opinion issued in corresponding International Patent Application No. PCT/JP2013/000405 dated Apr. 16, 2013.

International Preliminary Report on Patentability dated Aug. 14, 2014, for the corresponding International application No. PCT/JP2013-000405.

Supplementary European Search Report issued in corresponding European Patent Application No. 13743182.1 dated Jul. 21, 2015.

Helmuth Lemme, "Elektronik 21/1999" vol. 48, No. 21, Constructional Elements, Oct. 19, 1999, pp. 106, 109-112.

European Office Action dated Feb. 23, 2017, in corresponding EP Patent Application No. 16150173.9.

Joachim Quasdorf, "A Case Study: *MR* vs. *Hall Effect for Position Sensing*," Sensors, Nov. 1, 2005, pp. 1-3, XP055263320, retrieved from the internet.

* cited by examiner

FIG. 13

| | OUTPUT (1) OF SIGNAL AMPLIFYING UNIT | OUTPUT (2) OF SIGNAL AMPLIFYING UNIT | OUTPUT SIGNALS Sg', Sm' OF COMPUTING UNIT | CHANGE OF S/N |
|---|---|---|---|---|
| X-AXIS ACCELERATION SENSOR SIGNAL:Sg NOISE:±Ng | $Sg/\alpha 2$ $\pm Nm (=\pm Ng/\alpha 2)$ | $Sg/(\alpha 1 \cdot \alpha 2)$ $\pm Nm/\alpha 1$ | $Sg/(\alpha 1 \cdot \alpha 2) \pm Nm \cdot \sqrt{\dfrac{(1/\alpha 1)^2+1}{2}}$ | $SN_g = \dfrac{1}{\alpha 2}\sqrt{\dfrac{2}{\alpha 1^2+1}}$ -FOLD |
| X-AXIS MAGNETIC SENSOR SIGNAL:Sm NOISE:±Nm | $Sm$ $\pm Nm$ | $Sm$ $\pm Nm$ | $Sm \pm Nm \cdot \sqrt{\dfrac{(1/\alpha 1)^2+1}{2}}$ | $SN_m = \sqrt{\dfrac{2\alpha 1^2}{\alpha 1^2+1}}$ -FOLD |

PHASE 1

PHASE 2

PHASE 3

$V3 = \Delta R2 + \Delta R4$

PHASE 4

$V4 = -\Delta R4 + \Delta R1$

SIGNAL PROCESSING DEVICE

CROSS REFERENCE TO RELATED APPLICATIONS

The present application is a continuation of U.S. patent application Ser. No. 14/374,339, filed on Jul. 24, 2014, the entire disclosure of which is hereby incorporated by reference for all purposes as if fully set forth herein. U.S. patent application Ser. No. 14/374,339 is a U.S. National Stage Entry of PCT International Application No. PCT/JP2013/000405, filed on Jan. 25, 2013, and claims the benefit of Japanese Patent Applications No. 2012-101156, filed on Apr. 26, 2012; No. 2012-081433, filed on Mar. 30, 2012; No. 2012-054967, filed on Mar. 12, 2012; and No. 2012-021957, filed on Feb. 3, 2012.

TECHNICAL FIELD

The present invention relates to a signal processing device.

BACKGROUND ART

In the related art, the time-sharing process (Time Sharing System) has been adopted for processing plural analog signals.

To simply describe this signal processing system, this is a system for sequentially processing signals when one signal processing circuit such as, for example, only one amplifier circuit or AD (i.e., Analog to Digital) converter is provided. During a certain time period, a first analog signal is processed; during a subsequent time period, a second analog signal is processed; and during a further subsequent time period, a third analog signal is processed.

Such processing is an extremely clear system, but, on the other hand, a principal problem is present. For example, during a time period in which the first analog signal is processed, no other analog signal can be processed. Accordingly, the greater the number of analog signals, the greater will be the number of signals that are discarded without being processed. As a result, a phenomenon with deterioration of an SN ratio (i.e., Signal to Noise Ratio) of the signal occurs.

As a measure for overcoming such a problem, there has been known what is described in, for example, Patent Document 1. This measure is implemented mainly for sensor signals such as analog signals, and has a feature that plural signals are linearly combined in different combinations.

Generally speaking, such a measure is a type of modulation mentioned above and there exist only three types of modulating measures including "non-inverted signal" (i.e., the original sensor signal remains unchanged), "non-signal", and "inverted signal". Further, these three types can be constructed of only switches, thereby making it possible to expect a remarkable cost reduction and a reduction of power consumption while simultaneously improving the SN ratio.

CITATION LIST

Patent Literature

Patent Literature 1: WO 2008/032741

SUMMARY OF INVENTION

Problems to be Solved

However, there is a demand to be suited for the type or the number of sensors to be used.

The present invention has been made in view of the above-described circumstances, and the object of this invention is to provide a signal processing device that achieves an improved SN ratio and is suited for the type and the number of sensors to be used.

Solution to Problem

According to one aspect of the present invention, there is provided a signal processing device including a combination unit (a combination unit 3 illustrated in, for example, FIG. 1) configured to combine a plurality of element signals (output voltages V1 to V4 illustrated in, for example, FIG. 3) based on a plurality of physical quantity signals (the output voltages V1 to V4 illustrated in, for example, FIG. 3) including signal components in accordance with desired physical quantities, respectively, by the number of times equal to or greater than a number of the plurality of physical quantity signals, and to output combined signals (for example, combined signals C1 to C4 output from the combination unit 3) different from each other; a measuring unit (a measuring unit 4 as illustrated in, for example, FIG. 1) configured to sequentially receive the combined signals output from the combination unit; and a computing unit (a computing unit 5 as illustrated in, for example, FIG. 1) configured to compute signal components based on the desired physical quantities from signals that are generated based on the combined signals sequentially output from the measuring unit.

The computing unit may linearly combine the combined signals sequentially output from the measuring unit, and computes the signal components based on the desired physical quantities from results of linear combination.

The conversion of the computing unit for linearly combining and conversion of the combination unit for defining the combined signals may be inverse linear conversions from each other.

The number of the plurality of physical quantity signals may be equal to or greater than four.

The number of times the combination unit outputs the combined signals maybe equal to the number of the plurality of physical quantity signals, and the inverse linear conversions may have a relationship of an inverse matrix from each other.

Specifically, "the relationships of an inverse matrix" herein may include the inverse matrix and a constant factor of the inverse matrix. That is, assuming that "B" is an inverse matrix of a matrix "A", "a relationship of an inverse matrix" described above may include the relationship between the matrix "A" and a matrix of "constant factor× B"" that is a constant multiple of the inverse matrix "B".

The signal processing device may further comprise a signal inverting unit (for example, a signal inverting unit) configured to receive the plurality of physical quantity signals, to output a predetermined signal of the plurality of element signals respectively corresponding to the physical quantity signals as an inverted signal in which a physical quantity signal is inverted as an element signal, and to output a remaining signal of the plurality of element signals as a non-inverted signal in which the physical quantity signal is not inverted as the element signal, wherein the combination unit may combine the inverted signal and the non-inverted signal by the number of times equal to or greater than the number of the plurality of physical quantity signals.

The signal inverting unit may receive the plurality of physical quantity signal: to perform an amplification process of amplifying one or more signals of the plurality of physical quantity signals at a predetermined amplification rate, and not amplifying or amplifying a remaining signal of the plurality of physical quantity signals at another amplification rate different from the predetermined amplification; and to perform an inversion process of inverting the physical quantity signal of a predetermined signal of the plurality of physical quantity signals to become the inverted signal, and not inverting the physical quantity signal of a remaining signal to become a non-inverted signal, wherein the signal inverting unit may output signals of the plurality of physical quantity signals in which the amplification process and the inversion process are respectively performed, as the plurality of element signals, and wherein the combination unit may combine the plurality of element signals including the inverted signal of the plurality of element signals and the element signal including the non-inverted signals of the plurality of element signals by the number of times equal to or greater than the number of the plurality of physical quantity signals, and outputs the combined signals.

In addition, "amplification process", as used herein, may include an operation of amplifying one or more signals at a predetermined amplification rate, does not change a remaining signal that is the physical quantity signal, and amplifying one or more signals at a predetermined amplification rate and amplifying a remaining signal at another amplification rate different from the predetermined amplification rate.

Further, "inversion process" may include an operation of inverting the physical quantity signal of a predetermined signal of the plurality of physical quantity signals to become the inverted signal, and not inverting the physical quantity signal of a remaining signal to become a non-inverted signal.

The signal inverting unit may amplify a signal having a minimum SN (Signal to Noise) ratio of the plurality of element signals respectively corresponding to the plurality of physical quantity signals at a predetermined amplification rate greater than 1.0 in an absolute value, and does not amplify or amplifies a remaining signal at another amplification rate having an absolute value smaller than the absolute value of the predetermined amplification rate.

The signal inverting unit may output a signal having a minimum SN ratio of the plurality of element signals respectively corresponding to the plurality of physical quantity signals without change, and amplifies a remaining signal at an amplification rate smaller than 1.0 in an absolute value.

The number of the plurality of physical quantity signals may be equal to or greater than N, where N is an integer equal to or greater than 5, and the signal inverting unit may invert and amplifies a predetermined signal by $((N/2)-1)$ times to become the inverted signal.

The computing unit may compute a signal component based on the desired physical quantity based on linearly combined data in which the combined signal output from the combination unit and a given coefficient are linearly combined, and the coefficient may not include 0 and has the absolute values all of which are equal.

The plurality of physical quantity signals may include signals output from at least two types of sensors for measuring different physical quantities.

The plurality of physical quantity signals may include signals output from two or more sensors, and the two or more sensors include a sensor having at least one of sensitivity and the SN ratio different from the sensitivity or the SN ratio of the other sensor.

According to another aspect of the present invention, there is provided a plurality of resistance type sensors (resistance type sensors 31-1 to 31-4 as illustrated in, for example, FIG. 19) configured to detect predetermined physical quantities, and having resistances varying depending on detected physical quantities; a detection circuit forming unit (a detection circuit forming unit 32 as illustrated in, for example, FIG. 19) configured to select two or more predetermined resistance type sensors from the plurality of resistance type sensors, and to form a predetermined resistance detection circuit (a half-bridge circuit or a full-bridge circuit as illustrated in, for example, FIG. 29) including the two or more resistance type sensors that have been selected; a measuring unit (a measuring unit 33 as illustrated in, for example, FIG. 19) configured to sequentially receive output signals from the resistance detection circuit that has been formed; and a computing unit (a computing unit 34 as illustrated in, for example, FIG. 19) configured to compute, including an operation of linearly combining the output signals sequentially output from the measuring unit to compute the physical quantities.

The detection circuit forming unit may select two or more resistance types that are different for each time period from the plurality of resistance type sensors, and forms the predetermined resistance detection circuit including the two or more resistance type sensors that have been selected.

The plurality of resistance type sensors may include three or more resistance type sensors.

The detection circuit forming unit may select two or more resistance type sensors that detect predetermined physical quantities independent from each other from the plurality of resistance type sensors, and forms the predetermined resistance detection circuit including the two or more resistance type sensors that have been selected.

The two or more resistance type sensors that have been selected may be sensors that simultaneously detect either physical quantities of two or more axes orthogonal to each other or two or more types of physical quantities and change resistances depending on detected values.

The computing unit may compute components of the predetermined physical quantities on either two axes orthogonal to each other or three axes.

The predetermined physical quantities may be magnetic fields.

The resistance detection circuits may be made of either half-bridge circuits or full-bridge circuits, and the detection circuit forming unit may alternately form the half-bridge circuits and the full-bridge circuits.

The computing unit may linearly combine the output signals from the resistance detection circuits sequentially received by the measuring unit and coefficients corresponding to the output signals from the resistance detection circuits to generate linearly combined data.

Advantageous Effects of Invention

According to an aspect of the present invention, it becomes possible to provide a signal processing device suited for the type and the number of sensors in use while achieving the improvement of an SN ratio.

BRIEF DESCRIPTION OF THE DRAWINGS

FIG. 13 is an illustrative view for illustrating calculation results of SN ratios under a situation where in embodiment 2 of FIG. 10, not only signals of the sensors but also the magnitude of noises are different;

DESCRIPTION OF EMBODIMENTS

Next, embodiments of the present invention will be described below with reference to the accompanying drawings.

First, embodiment 1 will be described.
(Configuration of Embodiment 1)

Figure 1:
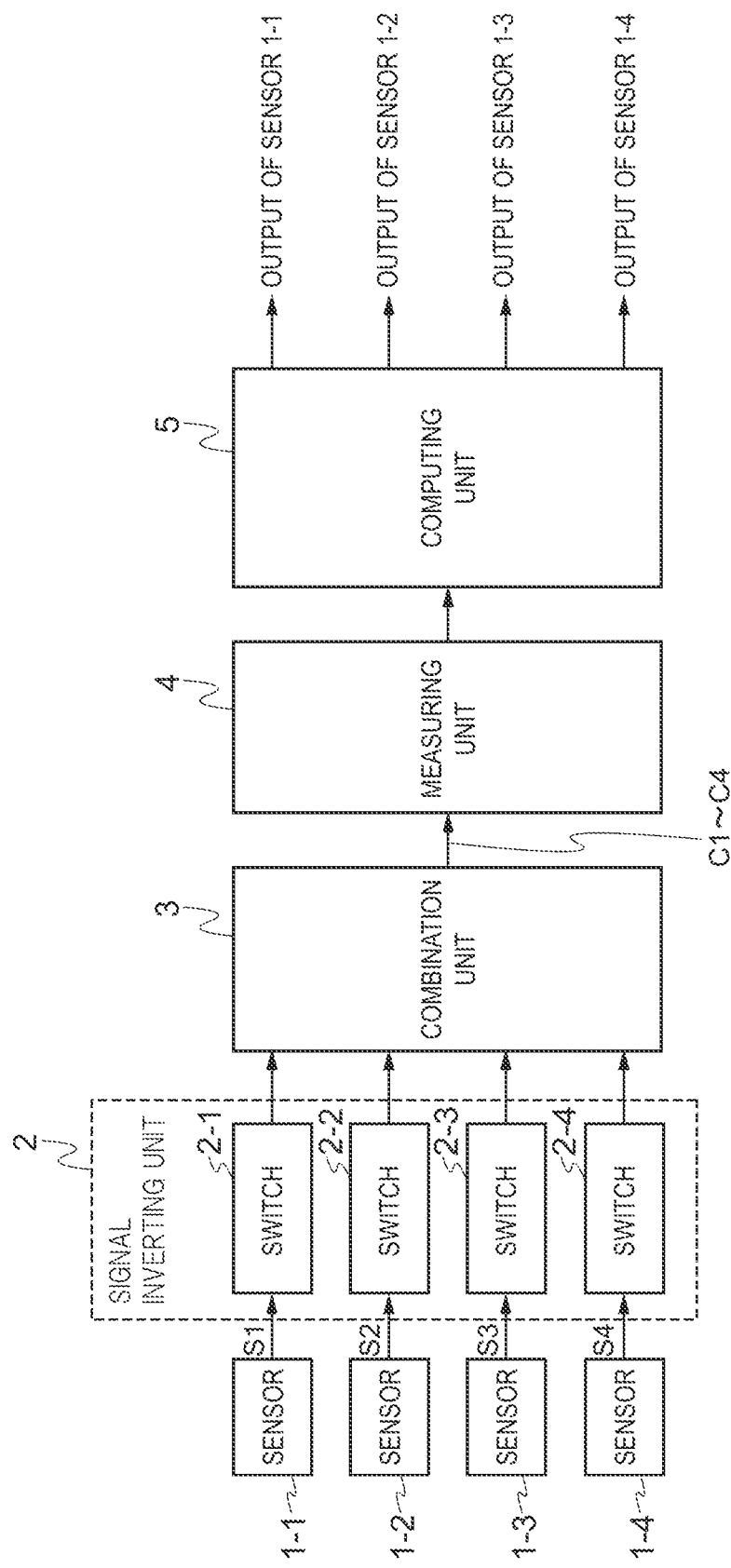
FIG. 1 is a block diagram illustrative of a configuration example of embodiment 1 of a signal processing device according to the present invention.

FIG. 1 is a block diagram illustrative of a configuration example of embodiment 1 of a signal processing device according to the present invention.

As illustrated in FIG. 1, the signal processing device of embodiment 1 includes four sensors 1-1 to 1-4, a signal inverting unit 2 having four switches 2-1 to 2-4, a combination unit 3, a measuring unit 4, and a computing unit 5.

The four sensors 1-1 to 1-4 respectively convert physical quantities into electrical signals to be output as output signals. The types of these sensors 1-1 to 1-4 are not limited and any type of sensors different from each other can be used. In the following description, it is supposed that the sensors 1-1 to 1-4 have configurations including sensor sensitive parts each having both ends provided with electrode terminals, that is, two-terminal type sensors.

The four switches 2-1 to 2-4 are provided in association with the four sensors 1-1 to 1-4, respectively. That is, the switches 2-1 to 2-4 are connected to the associated sensors 1-1 to 1-4, respectively, and have similar functions.

Figure 2:
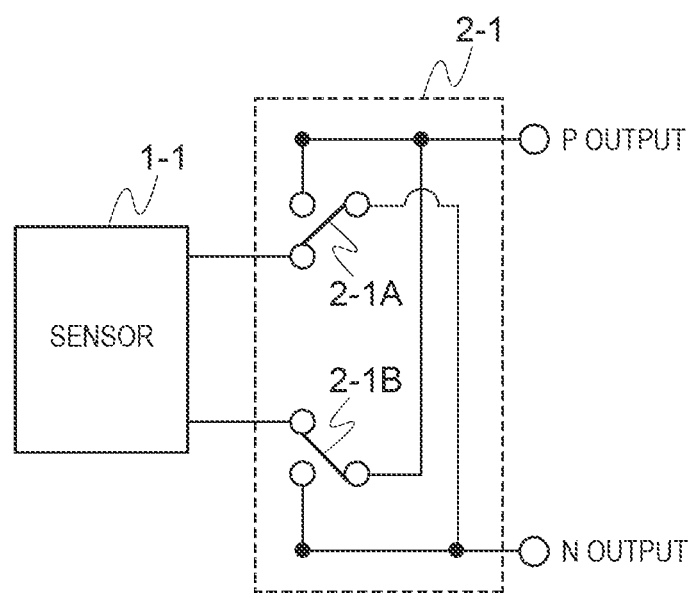
FIG. 2 is a circuit diagram illustrative of a configuration example of a sensor and switches.

As illustrated in, for example, FIG. 2, the switch 2-1 includes two changeover switches 2-1A and 2-1B connected to output sides of the sensor 1-1. Therefore, the two changeover switches 2-1A and 2-1B perform switching operations, so that an output signal of the sensor 1-1 can be inverted and output as an inverted signal or the output signal cannot be inverted such that the output signal is output as a non-inverted signal without change. The switches 2-2 to 2-4 are connected to the sensors 1-2 to 1-4 and have the same functions with the function of the switch 2-1.

FIG. 2 represents a case where the output signal of the sensor 1-1 is inverted by the switch 2-1, and the switch 2-1 outputs an inverted signal.

The combination unit 3 generates combined signals C1 to C4 by serially connecting (i.e., combining) respective output signals S1 to S4 output from the switches 2-1 to 2-4. Alternately, the combined signals C1 to C4 are generated by connecting these output signals S1 to S4 in parallel.

Here, when the sensors 1-1 to 1-4 are configured as the two-terminal type sensors, there are, for example, voltage output types and current output types. Therefore, when the sensors 1-1 to 1-4 are configured as the voltage output types, the combined signals are generated with the respective output signals connected in series. In the case of the current output types, the combined signals are generated with the respective output signals connected in parallel.

Further, when the sensors 1-1 to 1-4 are configured as other output types, that is, for example, capacitive types or resistive types, electric circuits maybe provided for converting values into voltages or currents.

The measuring unit 4 sequentially receives the combined signals C1 to C4 that are generated by the combination unit 3 in synchronization with opening and/or closing operations of the switches 2-1 to 2-4. These combined signals C1 to C4 are subjected to a predetermined process such as an amplification or AD conversion.

The computing unit 5 performs predetermined computations to linearly combine the combined signals C1 to C4 to be received by the measuring unit 4 and subsequently subjected to a predetermined process. Under such linear combination, the predetermined computations are performed for obtaining respective output values of the sensors 1-1 to 1-4 and computation results are output.

Computing operations of the computing unit 5 for the respective output values of the sensors 1-1 to 1-4 may be realized by a CPU (Central Processing Unit) or a computer using software or the like.

Next, configurations of specific examples from the sensors 1-1 to 1-4 to the measuring unit 4 of FIG. 1 will be described with reference to FIG. 3.

Figure 3:
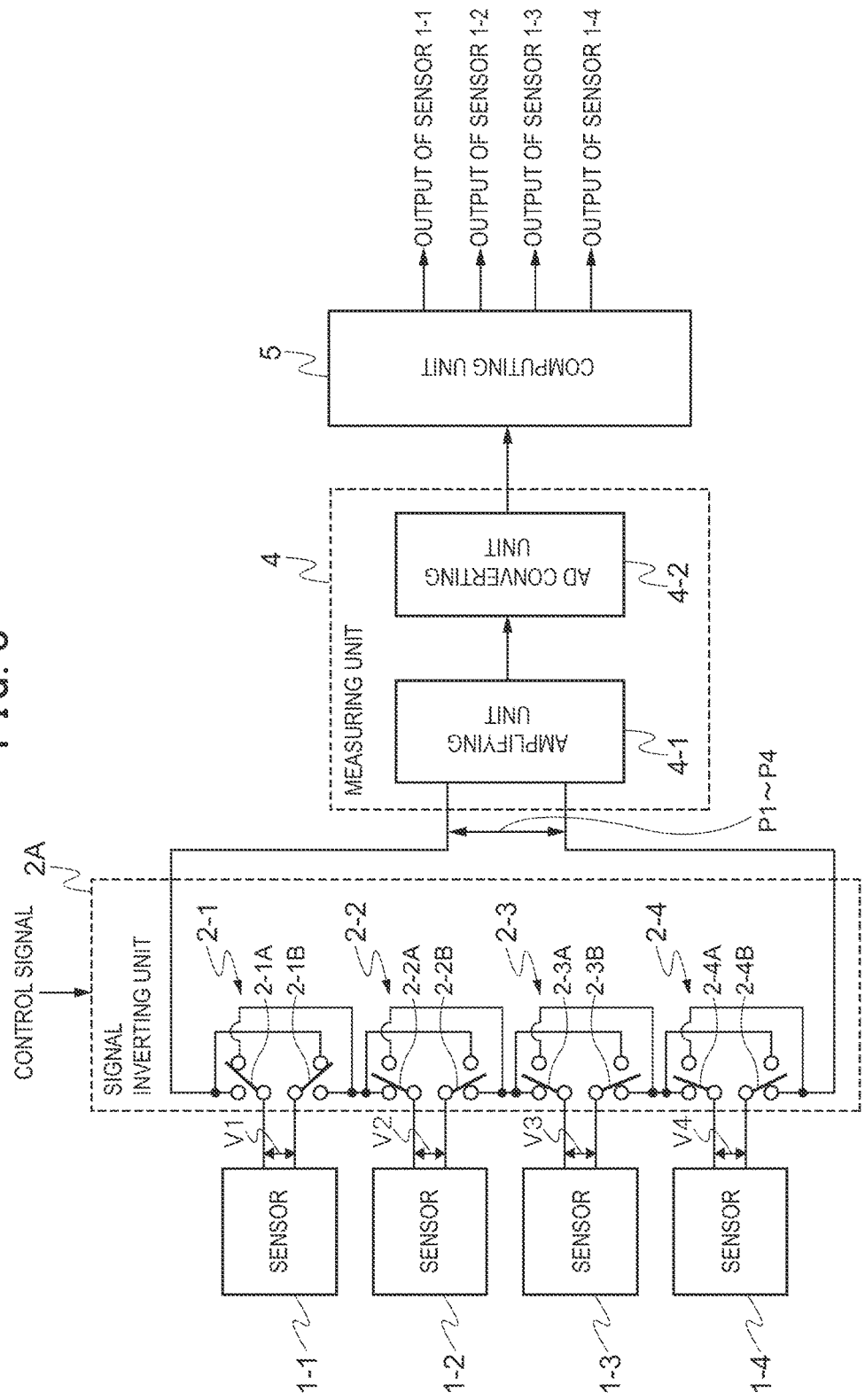
FIG. 3 is a block diagram illustrative of a configuration of a case wherein embodiment 1, illustrated in FIG. 1, adopts sensors of voltage output types having two terminals.

FIG. 3 is a block diagram illustrative of a configuration in which embodiment 1 of FIG. 1 adopts voltage output type sensors with two terminals as the sensors 1-1 to 1-4.

The signal processing device of embodiment 1 includes the four sensors 1-1 to 1-4, a signal inverting unit 2A, the measuring unit 4, and the computing unit 5.

Embodiment 1 represents the configuration, corresponding to the signal inverting unit 2 and the combination unit 3 of embodiment 1 illustrated in FIG. 1, which is embodied by using the signal inverting unit 2A as illustrated in FIG. 3.

The signal inverting unit 2A permits the switching operations of the switches 2-1 to 2-4. The switches 2-1 to 2-4 generate the inverted voltages and the non-inverted voltages by inverting or non-inverting the output voltages V1 to V4 of the sensors 1-1 to 1-4, which are selectively output.

Further, the signal inverting unit 2A serially combines the inverted voltages or the non-inverted voltages selectively output from the switches 2-1 to 2-4, respectively, such that voltages P1 to P4 are generated. The voltages P1 to P4 are sequentially output from both terminals of the switches 2-1 to 2-4.

More particularly, the switch 2-1 includes changeover switches 2-1A and 2-1B, which are switched to selectively output the inverted voltage and the non-inverted voltage, resulting from inverting or non-inverting the output voltage V1 of the sensor 1-1. Further, the switch 2-2 includes changeover switches 2-2A and 2-2B, which are switched to selectively output the inverted voltage and the non-inverted voltage by inverting or non-inverting the output voltage V2 of the sensor 1-2.

Furthermore, the switch 2-3 includes changeover switches 2-3A and 2-3B, which are switched to selectively output the inverted voltage and the non-inverted voltage by inverting or non-inverting the output voltage V3 of the sensor 3. Moreover, the switch 2-4 includes changeover switches 2-4A and 2-4B, which are switched to selectively output the inverted voltage and the non-inverted voltage by inverting or non-inverting the output voltage V4 of the sensor 4.

Further, the switches 2-1 to 2-4 are connected in series as illustrated in FIG. 3 to serially combine the inverted voltages or the non-inverted voltages selectively output from the switches 2-1 to 2-4 so as to generate the voltages P1 to P4.

Here, an example of FIG. 3 is a case where the output voltage V1 of the sensor 1-1 is inverted by the switch 2-1. The switch 2-1 outputs an inverted voltage −V1. The respective output voltages V2 to V4 of the sensors 1-2 to 1-4 is not inverted by the switches 2-2 to 2-4. The switches 2-2 to 2-4 output the non-inverted voltages V2, V3, and V4. Therefore, the output voltages of the signal inverting unit 2A are given to be (−V1+V2+V3+V4).

The measuring unit 4 sequentially receives the voltages P1 to P4 generated by the signal inverting unit 2A in synchronization with the opening and closing operations of the switches 2-1 to 2-4 for performing amplifications and AD conversions. To this end, the measuring unit 4 includes an amplifying unit 4-1 and an AD converting unit 4-2 as illustrated in FIG. 3.

The computing unit 5 performs predetermined computations to linearly combine the voltages P1 to P4 of output data output from the AD converting unit 4-2. Under such linear combination, predetermined computations are performed to obtain respective output values of the sensors 1-1 to 1-4 and computation results are output.

(Operation of Embodiment 1)

Next, an operation example of embodiment 1 will be described with reference to FIG. 3 and FIG. 4.

It is supposed that in FIG. 3, the switches 2-1 to 2-4 of the signal inverting unit 2A perform the switching operations in response to control signals given from a control unit (not illustrated).

Figure 4:
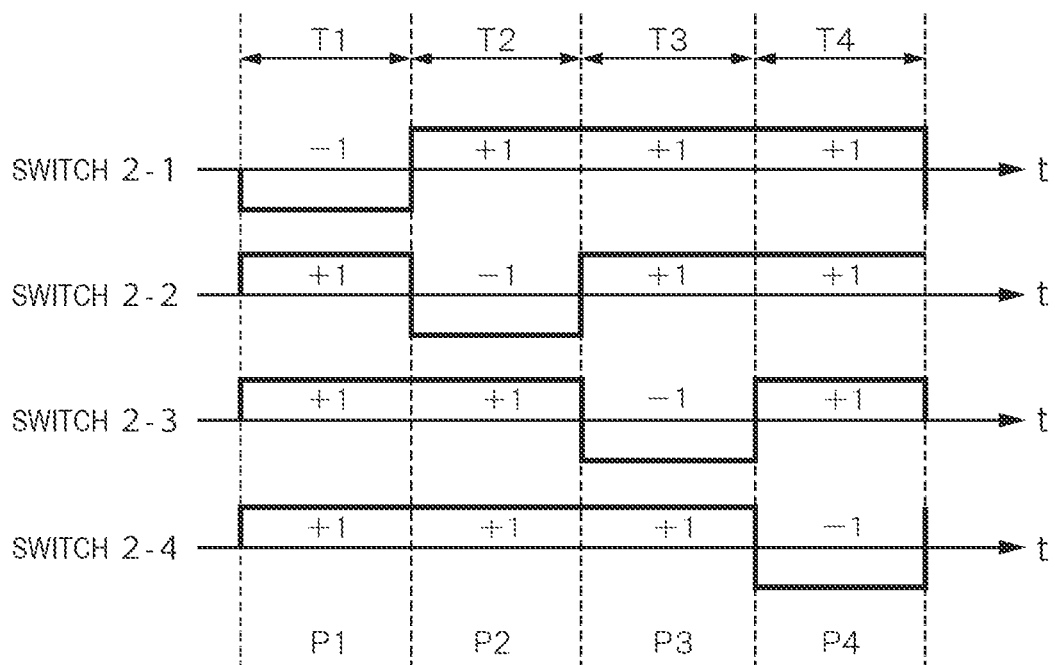
FIG. 4 is a timing chart for illustrating operation of embodiment 1.

The switches 2-1 to 2-4 have first to fourth operating states, as illustrated in FIG. 4, and respective operations are performed during first to fourth periods T1 to T4.

First, during the first period T1, the switches 2-1 to 2-4 of the signal inverting unit 2A have the operating states as illustrated in FIG. 3.

Therefore, the voltage obtained by the switch 2-1 is the inverted voltage −V1 of the sensor 1-1. Moreover, the respective voltages obtained by the switches 2-2 to 2-4 are the non-inverted voltages V2, V3, and V4 of the sensors 1-2 to 1-4.

Thus, the voltages obtained by the switches 2-1 to 2-4 have values of −1 time, +1 time, +1 time, and +1 time the output voltages V1 to V4 of the sensor 1-1. In FIG. 4, a non-inverted output of the switch is indicated by "+1" and an inverted output of the switch is indicated by "−1".

Accordingly, when during the first period T1, P1 is the output voltage output from the signal inverting unit 2A and processed at the measuring unit 4 and subsequently output from the AD converting unit 4-2 of the measuring unit 4, the output voltage P1 is proportional to (−V1+V2+V3+V4).

Next, during the second to fourth periods T2 to T4, the switches 2-1 to 2-4 of the signal inverting unit 2A take the operating states in which the respective voltages are obtained as follows (see FIG. 4).

That is, during the second period T2, the non-inverted voltages V1, the inverted voltage −V2, and the non-inverted voltages V3 and V4 are obtained from the switches 2-1 to 2-4. During the third period T3, the non-inverted voltages V1 and V2, an inverted voltage −V3 and a non-inverted voltage V4 are obtained from the switches 2-1 to 2-4. During the fourth period T4, the non-inverted voltages V1, V2, and V3 and an inverted voltage −V4 are obtained from the switches 2-1 to 2-4.

Suppose that the output voltages, output from the AD converting unit 4-2 of the measuring unit 4, are P1 to P4 during the periods T1 to T4, respectively, the output voltages P1 to P4 are given by the following equations (1) to (4).

$$P1 = -V1+V2+V3+V4 \qquad (1)$$

$$P2 = V1-V2+V3+V4 \qquad (2)$$

$$P3 = V1+V2-V3+V4 \qquad (3)$$

$$P4 = V1+V2+V3-V4 \qquad (4)$$

From these four equations, the computing unit 5 is capable of inversely obtaining the output voltages V1 to V4 of the sensors 1-1 to 1-4, and, in particular, this can be given by the following equations.

$$V1 = \tfrac{1}{4} \cdot (-P1+P2+P3+P4) \qquad (5)$$

$$V2 = \tfrac{1}{4} \cdot (P1-P2+P3+P4) \qquad (6)$$

$$V3 = \tfrac{1}{4} \cdot (P1+P2-P3+P4) \qquad (7)$$

$$V4 = \tfrac{1}{4} \cdot (P1+P2+P3-P4) \qquad (8)$$

According to embodiment 1, thus, it becomes possible to obtain the respective output voltages of the four sensors 1-1 to 1-4.

Next, a study will be conducted as to how much the SN ratio is improved in embodiment 1.

Figure 5:
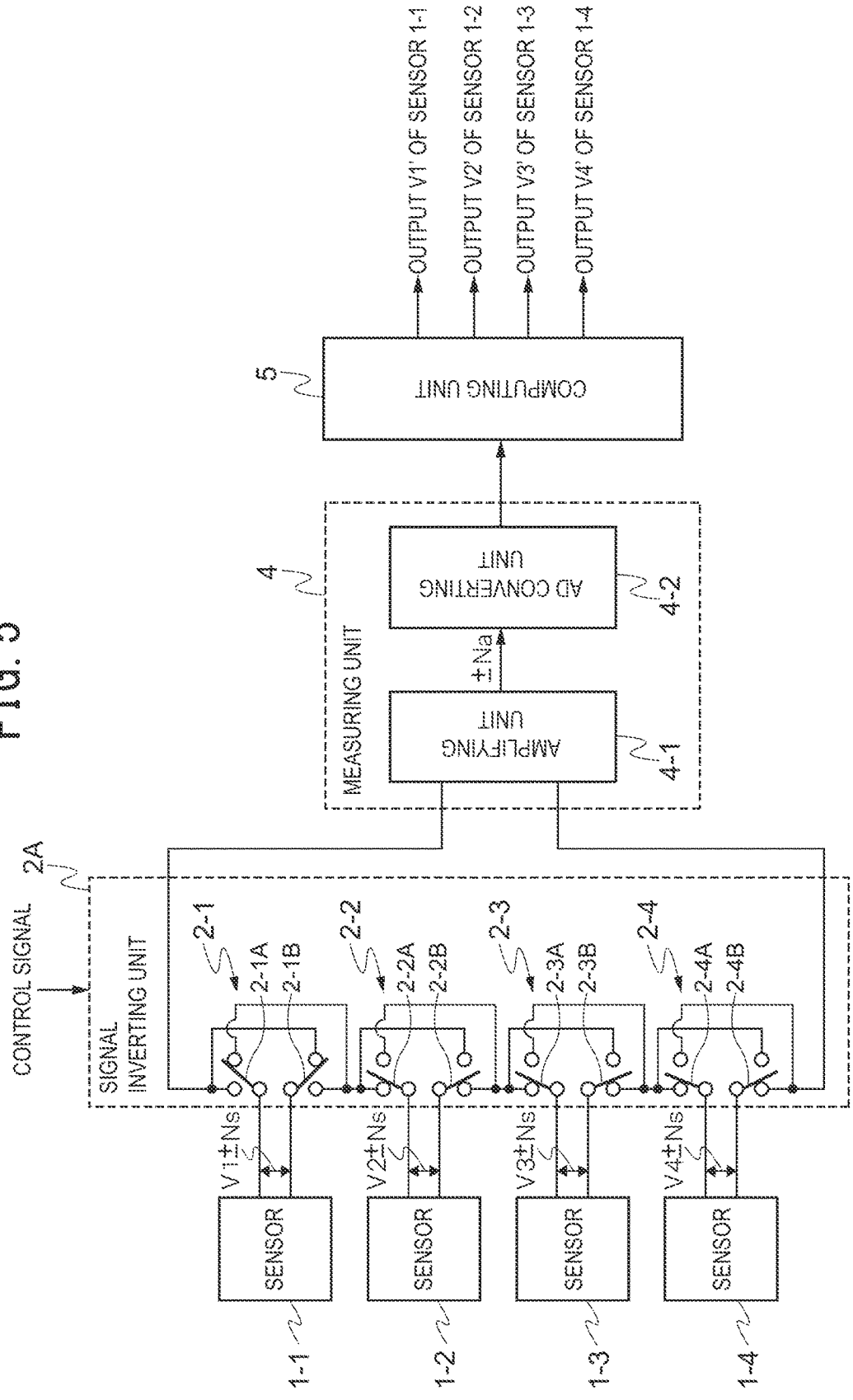
FIG. 5 is a block diagram of a case where noise is superimposed in embodiment 1 illustrated in FIG. 3 with a view to studying noise.

FIG. 5 illustrates a case where noise (i.e., disruptive noise) is superimposed on a measuring system of FIG. 3.

It is supposed that this noise takes noise with a fixed value against white noise, that is, against all frequency bands, and that a noise value is expressed as ±N. In addition, it is supposed that all of the four sensors have noises with the same magnitude of ±Ns which are mutually uncorrelated.

Meanwhile, it is supposed that noise generated by the signal inverting unit 2A is extremely small and ignored (i.e., with no noise) and that noise of the amplifying unit 4-1 of the measuring unit 4 is determined to be ±Na. Moreover, it is supposed that noise of the amplifying unit 4-2 of the measuring unit 4 is ignored.

Then, the output voltages P1 to P4 of the AD converting unit 4-2 are given as follows:

$$P1 = -(V1 \pm Ns) + (V2 \pm Ns) + (V3 \pm Ns) + (V4 \pm Ns) \pm Na \quad (9)$$

$$P2 = (V1 \pm Ns) - (V2 \pm Ns) + (V3 \pm Ns) + (V4 \pm Ns) \pm Na \quad (10)$$

$$P3 = (V1 \pm Ns) + (V2 \pm Ns) - (V3 \pm Ns) + (V4 \pm Ns) \pm Na \quad (11)$$

$$P4 = (V1 \pm Ns) + (V2 \pm Ns) + (V3 \pm Ns) - (V4 \pm Ns) \pm Na \quad (12)$$

Here, since noises of the sensors 1-1 to 1-4 are uncorrelated to each other, the above four equations are simplified as follows.

$$P1 = -V1 + V2 + V3 + V4 \pm 2Ns \pm Na \quad (13)$$

$$P2 = V1 - V2 + V3 + V4 \pm 2Ns \pm Na \quad (14)$$

$$P3 = V1 + V2 - V3 + V4 \pm 2Ns \pm Na \quad (15)$$

$$P4 = V1 + V2 + V3 - V4 \pm 2Ns \pm Na \quad (16)$$

These four equations are subjected to the same computations as those performed for the V1 to V4 of the above equations (5) to (8). When the output V1 of the sensor 1-1 needs to be obtained, ¼·(−P1+P2+P3+P4) is only to be calculated. Even in the equations (13) to (16), only an item of V1 remains and V2, V3, and V4 disappear.

Further, the output voltages P1 to P4 of the AD converting unit 4-2 are measured in different time periods and, basically, sensor noises and amplifying noises are uncorrelated to the measuring time periods with each other.

Accordingly, an output V1' of the sensor 1-1, with noise taken into consideration, is given by the following equation.

$$V1' = V1 \pm Ns \pm \tfrac{1}{2} \cdot Na \quad (17)$$

This demonstrates that the amplifying unit 4-1 has a noise level reduced by ½, as compared to the output V1±Ns±Na occurring during the time-sharing process, and thus the S/N ratio is improved.

With noises taken into consideration, outputs V2' to V4' of the other sensors 1-1 to 1-4 are similarly provided to be given by the following equations.

$$V2' = V2 \pm Ns \pm \tfrac{1}{2} \cdot Na \quad (18)$$

$$V3' = V3 \pm Ns \pm \tfrac{1}{2} \cdot Na \quad (19)$$

$$V4' = V4 \pm Ns \pm \tfrac{1}{2} \cdot Na \quad (20)$$

Therefore, all the S/N ratios can be improved.

In particular, when supposed that the sensors 1-1 to 1-4 have noises ±Ns that are extremely small in magnitude that can be ignored as compared to noise ±½·Na of the amplifying unit 4-1, embodiment 1 is capable of exhibiting the maximum effect.

A whole of the foregoing descriptions have been made for the specified case demonstrated by the timing chart of FIG. 4. Now a description will be given of plural cases that can exhibit the same effect as those mentioned above and a theory by which such plural cases can be led.

For the sake of convenience of description, first, states of the switches 1-1 to 1-4 of FIG. 4 are provided in matrix representation. Suppose this matrix is S, which is expressed as follows.

$$S = \begin{pmatrix} -1 & +1 & +1 & +1 \\ +1 & -1 & +1 & +1 \\ +1 & +1 & -1 & +1 \\ +1 & +1 & +1 & -1 \end{pmatrix} \quad \text{(Expression 1)}$$

This matrix S represents temporary changes of the states of the switches 2-1 to 2-4 for the respective sensors 1-1 to 1-4 in terms of +1 (i.e., non-inverted) or −1 (i.e., inverted) as mentioned above. When focusing on the matrix, it can be said that the states of the switches for the sensors 1-1 to 1-4 are demonstrated in terms of the respective measuring time periods.

On the other hand, an inverse matrix $S^{-1}$ is given as follows.

$$S^{-1} = \frac{1}{4} \begin{pmatrix} -1 & +1 & +1 & +1 \\ +1 & -1 & +1 & +1 \\ +1 & +1 & -1 & +1 \\ +1 & +1 & +1 & -1 \end{pmatrix} \quad \text{(Expression 2)}$$

The inverse matrix $S^{-1}$ indicates a matrix in which coefficients of the above equations (5) to (8) are arranged.

This is a natural result in a linear algebra theory.

Hereinafter, for the sake of convenience, the above-noted matrix S is called switch matrix, and the above-noted inverse matrix $S^{-1}$ is called computation matrix and, with a view to deriving an optimum method, both of the matrixes are provided in a generalized display as follows.

$$S = \begin{pmatrix} a11 & a12 & a13 & a14 \\ a21 & a22 & a23 & a24 \\ a31 & a32 & a33 & a34 \\ a41 & a42 & a43 & a44 \end{pmatrix} \quad \text{(Expression 3)}$$

$$S^{-1} = \begin{pmatrix} b11 & b12 & b13 & b14 \\ b21 & b22 & b23 & b24 \\ b31 & b32 & b33 & b34 \\ b41 & b42 & b43 & b44 \end{pmatrix}$$

As indicated by the matrix, the switch matrix S has sixteen elements (i.e., parameters) from a11 to a44.

Here, the following condition is listed as a precondition 1 of embodiment 1 according to the present invention.

"Precondition 1: each element of the switch matrix S is either +1 or −1."

This precondition results from the fact that the states of the switches are limited to be non-inverted (+1) or inverted (−1). Such a limitation is made for a reason as will be described below.

It is not always impossible to allow the above element to take an arbitrary numeral (such as, for example, −2 or +10) by using a general electric circuit. However, when attempt is made to be set to −2, this means that a signal is inverted by 2 times and an amplifier circuit is naturally needed. Also, such amplifications need to be suitably performed for respective one of the four sensors. This similarly applies to a case of an example with +10. On the other hand, it is possible for +1 and −1 to be made of only the switches. Consequently, a circuit configuration can be remarkably compressed.

Further, as a value of the element made of only the switches, a value of 0 (zero) can be taken. This is a general time-sharing signal processing method (or a method simply on an extended line), and has no contribution to the improvement of the SN ratio that is an object of the present invention. Accordingly, only +1 and −1 are values of the elements that can achieve both the compression of the circuit configuration and the improvement of SN ratio.

However, even when the above limitation is made, it is conceived that there are still matrixes of 16-power of 2 patterns, that is, 65536 patterns.

The next precondition 2 represents a condition under which the above equations (5) to (8) can be computed.

"Precondition 2: the switch matrix S has to have the inverse matrix $S^{-1}$."

The precondition 2 can be mentioned in other words as follows by using the linear algebra theory.

"Precondition 2': a matrix expression of the switch matrix S must not be 0 (zero)."

This precondition results from the fact that such a precondition is only effective to a case where the present invention is capable of obtaining a computing matrix (i.e., the inverse matrix of the switch matrix) by using the equations (5) to (8). Accordingly, the 65536 patterns are reduced to 22272 patterns.

Subsequently, for the purpose of determining precondition 3, the above computing matrix $S^{-1}$ is partially extracted and studied. Extracting only the uppermost line from the computing matrix $S^{-1}$ to indicate the same equation as that of the equation (5), this is given as follows.

$$V1 = b11 \cdot P1 + b12 \cdot P2 + b13 \cdot P3 + b14 \cdot P4 \quad (21)$$

In the above equation, it is assumed that b11=0 is satisfied. b11=0 means that even when the output P1 from the AD converting unit 4-2 is an effective signal, such a signal is never utilized. Mathematically speaking, the signal component can be reduced by three quarters (0.75 times) with respect to the preceding special case. Accordingly, it cannot be said to be an optimum determining condition for the purpose of improving the SN ratio.

Next, a study will be conducted as to a case where the following condition is applied as precondition 3.

"Precondition 3: each element of the computing matrix is either +¼ or −¼."

Here, ±¼ indicates a numeric value that is fixed because the computing matrix $S^{-1}$ is defined to be the inverse matrix of the switch matrix S. In actual applications, as indicated above, a proportional coefficient of the output from the AD converting unit 4-2 can be arbitrarily obtained. Thus, the condition may be more loosely set than that mentioned above to be expressed below, "Precondition 3': each element in the computing matrix $S^{-1}$ is either +c or −c (provided that c≠0)" or "Precondition 3": all of the elements in the computing matrix $S^{-1}$ are not zero and all of respective absolute values are equal."

Even the above conditions will not lose generality.

The case number of the switch matrix S for satisfying this drastically reduces from 22272 patterns to 384 patterns (384 patterns are applied to all of preconditions 3, 3', and 3" in the same manner).

That is, 384 patterns is the case number where the switch matrix S exhibits the maximum effect according to the present invention.

As is apparent from the foregoing considerations, however, all of these 384 patterns provide the same effect of improving the SN ratio, and, in actual applications, one of 384 patterns can be suitably selected.

When studying a factor that can provide the same effect as those noted above in terms of an algebraic viewpoint, for example, the above-described 384 patterns include the following switch matrix S'.

$$S' = \begin{pmatrix} -1 & -1 & +1 & -1 \\ +1 & +1 & +1 & -1 \\ -1 & +1 & -1 & -1 \\ -1 & +1 & +1 & +1 \end{pmatrix} \quad \text{(Expression 4)}$$

However, the switch matrix S' can be restored to the previously-mentioned switch matrix S by performing the following operations.

Operation 1: multiply a first row and a third row by a factor of −1, respectively.

Operation 2: replace a fourth row to the first row, the third row to the second row, the first row to the third row, and the second row to the fourth row.

According to the present invention, in the operation 1, all of the non-inverted or inverted switching states are inversed. Such a mere modification gives no affect to the SN ratio. In addition, the operation 2 merely changes the numbering of the sensors and no generality is lost at all. By considering in the same manner, all of the 384 patterns can be theoretically returned to the switch matrix S mentioned above.

Moreover, as described above, the maximum effect of the present invention is to improve the SN ratio for the time-sharing process. To mention in such a sense, as described above, the switch matrix S may take any form as long as "each of the elements of the computing matrix S−1 is not zero and the respective absolute values are equal."

That is, it is necessary to pay attention to what is to be naturally applied in advance as a precondition is the computing matrix $S^{-1}$. In particular, it is an extremely effective method to apply the same technique as that of the present invention to more than four (i.e., equal to or greater than five) sensors. The description heretofore has been provided for clarity of the technical content of the present invention with attention especially focused on the four sensors.

Incidentally, applying the conditions up to precondition 3 demonstrates that the switch matrix S and the computing matrix $S^{-1}$ are present in 384 patters. Hereinafter, description is made of how the optimum matrix is further selected from the 384 patterns depending on the type of sensor signals.

The 384 patterns also include the following switch matrix S" that is different from the preceding switch matrixes S and S'.

$$S'' = \begin{pmatrix} -1 & -1 & -1 & -1 \\ -1 & -1 & +1 & +1 \\ -1 & +1 & -1 & +1 \\ -1 & +1 & +1 & -1 \end{pmatrix} \quad \text{(Expression 5)}$$

For the switch matrix S", the following operations are performed in the same ways as those for the switch matrix S' mentioned above.

Operation 1: multiply the first row by a factor of −1.

Operation 2: multiply the first row by a factor of −1 after the operation 1.

Upon performing the operations in these two stages, the switch matrix S is restored as described above.

Focusing on the first row of the switch matrix S", however, all of the values of the elements are −1 without including +1. Meanwhile, the second to fourth rows have the elements having values of both +1 and −1. This has the following meaning. That is, even when both the matrixes are coequal in view of the linear algebraic theory, signal processing of embodiment 1 of the present invention is performed. When this takes place, there exists a case where the second to fourth sensors have positive and negative orientations different from each other. In contrast, only the first sensor has the same orientation at all times (with the switch matrix S" being inverted at all times). Accordingly, it cannot be said that these matrixes are coequal in light of signal processing.

Therefore, by focusing on signal characteristics of the respective sensors, for example, the switch matrix S (or the switch matrix S') and the switch matrix S" can be selectively used as follows.

(1) "A case where all of the types (i.e., signal characteristics) of the four sensors are the same" or "a case where even though the four sensors belong to the different types, similar signal processing may be preferably performed."

In such cases, it is preferable for the four sensors to be symmetrical to each other in temporal change of the switches. Consequently, the switch matrix S or the switch matrix S' are recommended. In this case, there are 96 patterns from among the 384 patterns noted above.

(2) "A case where among the four sensors, three sensors are same but one sensor is different" or "a case where among the four sensors, only one sensor has extremely small impedance".

In such cases, it is preferable not to provide the switch for one sensor that is different. Accordingly, the switch matrix S" is recommended. In such a case, there are 288 patterns.

(Modification to Embodiment 1)

(1) Although the signal processing device of embodiment 1, illustrated in FIG. 3, belongs to a case where the sensors 1-1 to 1-4 are of the voltage output types having the two terminals, the sensors 1-1 to 1-4 may be replaced with current output types having two terminals.

In this case, the sensors 1-1 to 1-4 and the associated switches 2-1 to 2-5 are connected in a way similar to FIG. 3, but mutual connections between the switches 2-2 to 2-4 are modified from the serial connections illustrated in FIG. 3 to parallel connections.

(2) Although the signal processing device of embodiment 1 as illustrated in FIG. 1 and FIG. 3 has been described of four sensors, but two sensors maybe provided.

In the case where two sensors are provided, the same discussions as those noted above demonstrate that the SN ratio can be further improved than that of the related art by √2 times. This is accomplished by selecting a matrix, which is indicated by the following Expression 6, as the switch matrix S and selecting a matrix, which is indicated by the following expression 7, as the computing matrix $S^{-1}$.

$$S = \begin{pmatrix} +1 & +1 \\ +1 & -1 \end{pmatrix} \quad \text{(Expression 6)}$$

$$S^{-1} = \frac{1}{2}\begin{pmatrix} +1 & +1 \\ +1 & -1 \end{pmatrix} \quad \text{(Expression 7)}$$

Next, embodiment 2 will be described.

Embodiment 2 is related to a signal processing device that makes it possible to relatively increase an SN ratio of a sensor signal having a small SN ratio.

(Configuration of Embodiment 2)

Figure 6:
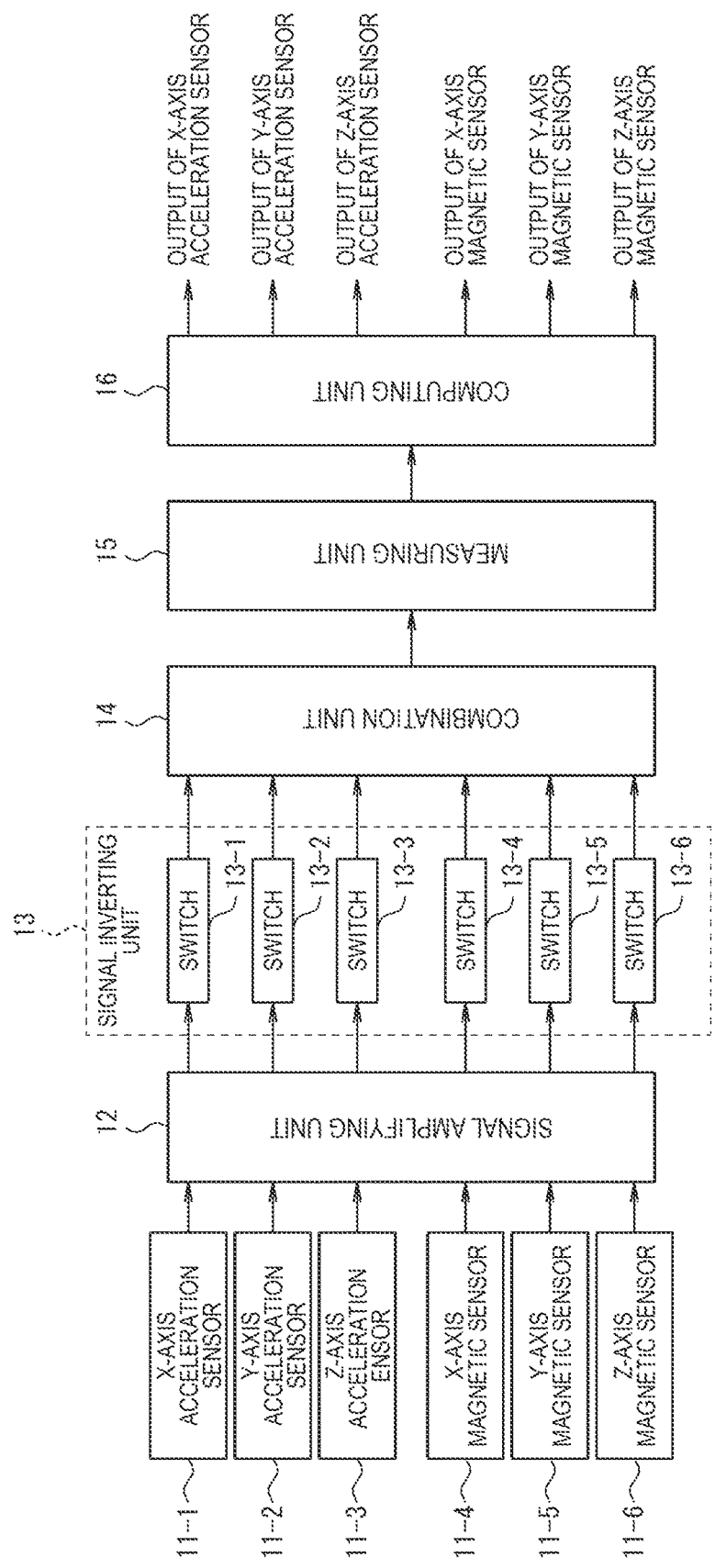
FIG. 6 is one example of a block diagram illustrative of an overall configuration of embodiment 2 of a signal processing device according to the present invention.

FIG. 6 is a block diagram illustrative of an overall configuration of the signal processing device of embodiment 2.

As illustrated in FIG. 6, the signal processing device of embodiment 2 includes: three acceleration sensors (i.e., an X-axis acceleration sensor, a Y-axis acceleration sensor, and a Z-axis acceleration sensor) 11-1 to 11-3, three magnetic sensors (i.e., an X-axis magnetic sensor, a Y-axis magnetic sensor, and a Z-axis magnetic sensor) 11-4 to 11-6, a signal amplifying unit 12, a signal inverting unit 13, a combination unit 14, a measuring unit 15, and a computing unit 16. The signal inverting unit 13 includes the signal amplifying unit 12 for amplifying outputs given from the sensors, and six switches 13-1 to 13-6 for inverting signals.

According to embodiment 2, the three acceleration sensors 11-1 to 11-3 and the three magnetic sensors 11-4 to 11-6 will be collectively referred to as a six-axis electronic compass.

As will be apparent from the following description, the number of the sensors is not limited to six and may be equal to or greater than two. In addition, the type of the sensors is not limited to the acceleration sensor or the magnetic sensor, and any number of sensor types may be provided as long as the sensor types are equal to or greater than two. Moreover, as will be described later, one type of the sensor may be provided.

The signal amplifying unit 12 amplifies an output signal of at least one predetermined sensor of the sensors 11-1 to 11-6, and then the amplified output signal is output. Further, "signal amplification", which is used in the present specification, may include the amplification of the signal to be less than 1.0 time, that is, the attenuation of the signal. Furthermore, the signal amplifying unit 12 does not amplify the output signal of at least one predetermined sensor of the sensors 11-1 to 11-6, and is output without amplification. To this end, the signal amplifying unit 12 includes a signal amplifier circuit, as will be described below.

Here, the signal amplifier circuit may be of an amplification rate that is preliminarily determined or of a variable type that can arbitrarily determine the amplification rate.

The switches 13-1 to 13-6 are respectively provided in association with the sensors 11-1 to 11-6. That is, the switches 13-1 to 13-6 are connected to the associated sensors 11-1 to 11-6 via the signal amplifying unit 12, respectively, and have functions similar to each other.

Figure 7:
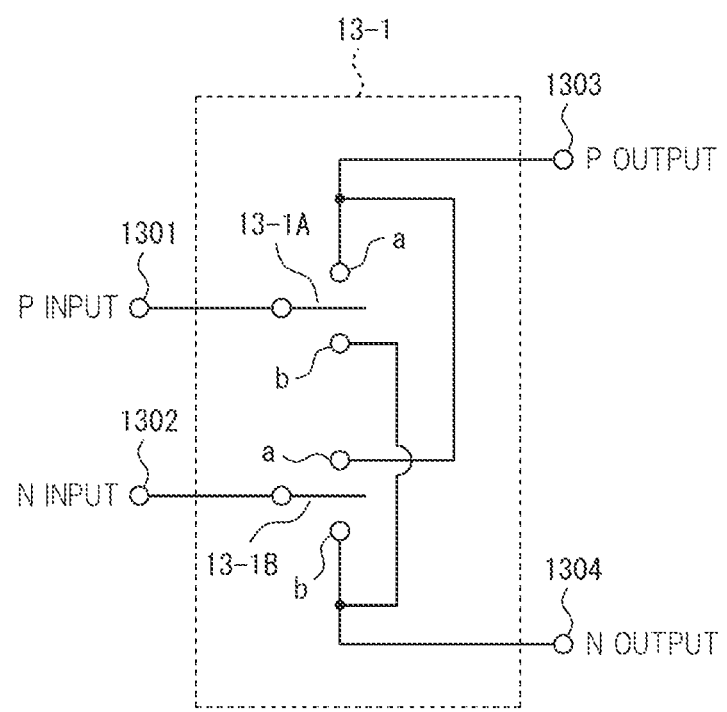
FIG. 7 is a circuit diagram illustrative of configuration examples of switches of FIG. 6.

The switches 13-1 to 13-6 take the same configurations, respectively, and among these, a configuration example of the switch 13-1 is illustrated in FIG. 7.

As illustrated in FIG. 7, for example, the switch 13-1 has two input terminals 1301 and 1302, two output terminals 1303 and 1304, and two changeover switches 13-1A and 13-1B.

In this example, the signal amplifying unit 12 amplifies the output signal of the sensor 11-1 to provide differential outputs, which are applied as differential inputs (a P-input and an N-input) to the input terminals 1301 and 1302. However, when the signal amplifying unit 12 does not amplify the output signal of the sensor 11-1, the output signal of the sensor 11-1 is applied without change to the input terminals 1301 and 1302.

In the switch 13-1 of such a configuration, the changeover switches 13-1A and 13-1B perform switching operations. This causes the differential input signals, applied to the input terminals 1301 and 1302, to be inverted to provide inverted signals or not to be inverted to provide non-inverted signals without change, which are output from the output terminals 1303 and 1304.

That is, when the differential input signals are inverted and then output, a changeover contact of the switch 13-1A is connected to a contact "b" and a changeover contact of the switch 13-1B is connected to a contact "a". Meanwhile, when the differential input signals are output without inversions, the changeover contact of the switch 13-1A is connected to the contact "a" and the changeover contact of the switch 13-1B is connected to the contact "b".

The combination unit 14 generates combined signals by serially connecting (i.e., combining) the output signals from the switches 13-1 to 13-6, or generates combined signals by connecting the output signals in parallel. When the sensors 11-1 to 11-6 are configured with the two-terminal type sensors, here, there are, for example, a voltage output type and a current output type. Therefore, when the sensors 11-1 to 11-6 are of the voltage output types, the respective output signals are combined in series to generate the combined signals, whereas in the case of the current output types, the respective output signals are combined in parallel to generate the combined signals.

Further, when the sensors 11-1 to 11-6 are configured with another output type, such as, for example, a capacitor type or a resistor type, any type of electric circuit may be provided as long as it converts them into voltages or currents.

The measuring unit 15 sequentially receives the combined signals generated by the combination unit 14 in synchronization with opening and closing operations of the switches 13-1 to 13-6, and performs a predetermined process such as amplification or AD conversion.

The computing unit 16 linearly combines the combined signal by performing predetermined computation on the combined signal which has been received and then a predetermined process has been performed by the measuring unit 15. Under such linear combination, predetermined computations are performed to obtain the respective output values of the sensors 11-1 to 11-6 and computation results are output. The computing process of the computing unit 16 for the respective output values of the sensors 11-1 to 11-6 can be achieved by a CPU (Central Processing Unit) or software or the like using a computer.

(Operation of Embodiment 2)

Next, the operation of embodiment 2 of such a configuration will be described.

Figure 8:
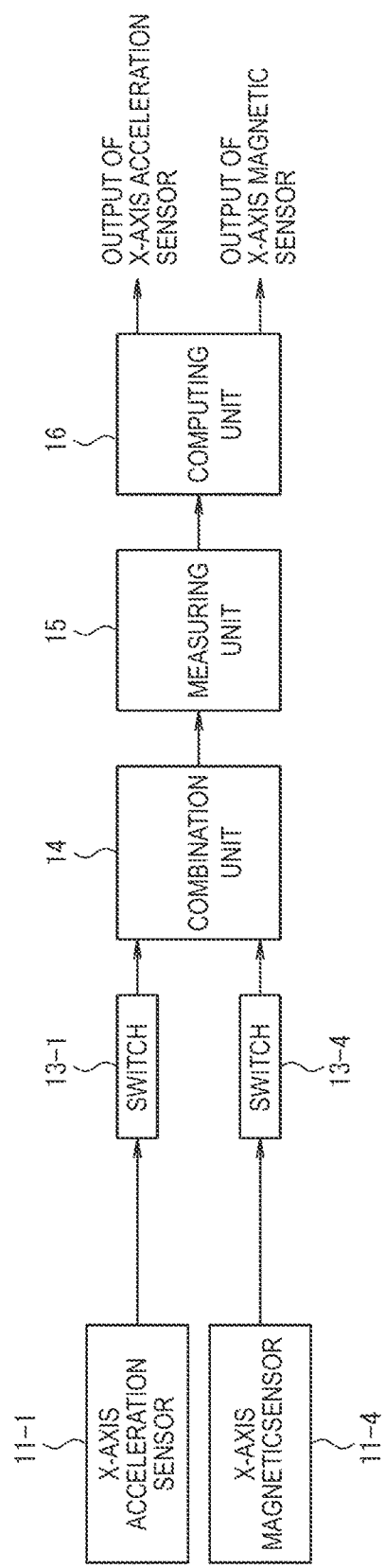
FIG. 8 is a block diagram illustrative of a configuration example of embodiment 2, illustrated in FIG. 6, wherein a part is extracted with this configuration example corresponding to comparative example 2.

Although embodiment 2 includes the signal amplifying unit 12 as illustrated in FIG. 6, first, description is made of an operation of the measuring system (configuration) illustrated in FIG. 8.

The measuring system is used for a case where, as illustrated in FIG. 8, the signal amplifying unit 12 illustrated in FIG. 6 is omitted and the processing is performed on only the output signals of the X-axis acceleration sensor 11-1 and the X-axis magnetic sensor 11-4.

Now, it is supposed that, in FIG. 8, the output signal of the X-axis acceleration sensor 11-1 is Sg and the output signal of and the X-axis magnetic sensor 11-4 is Sm.

Figure 9:
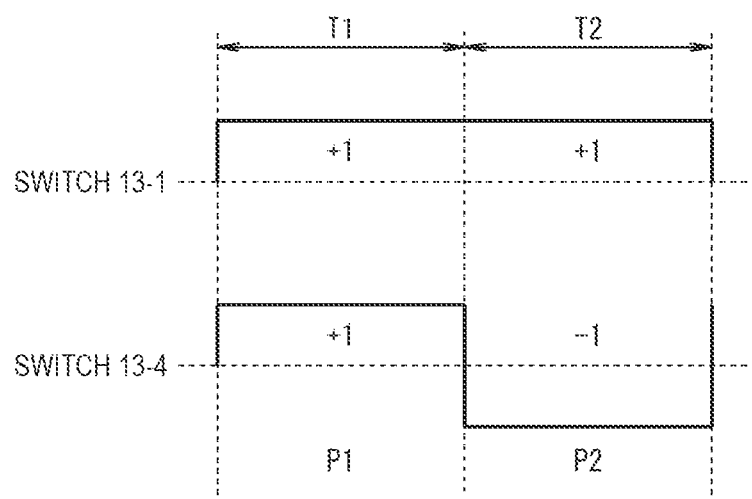
FIG. 9 is a timing chart for illustrating operation of FIG. 8.

It is supposed that the switches 13-1 and 13-4 perform switching operations in response to control signals given from the control unit (not illustrated). Further, the switches 13-1 and 13-4 have first and second operating states, as illustrated in FIG. 9, and respective operations are performed during first and second periods T1 and T2. In FIG. 9, "+1" designates that the switch provides a non-inverted output and "−1" designates that the switch provides an inverted output.

During the first period T1, first, the switches 13-1 and 13-4 of the signal inverting unit 13 have operating states as illustrated in FIG. 9. Therefore, an output signal of the switch 13-1 becomes a signal Sg with the output signal Sg of the sensor 11-1 being non-inverted, and an output signal of the switch 13-4 becomes a signal Sm with the output signal Sm of the sensor 11-4 being non-inverted. Accordingly, the output signals of the switches 13-1 and 13-4 correspond to those of the output signals Sg and Sm of the sensors 11-1 and 11-4 multiplied by factors of +1 and +1.

During the succeeding second period T2, the switches 13-1 and 13-4 of the signal inverting unit 13 take the operating states illustrated in FIG. 9. Therefore, the output signal of the switch 13-1 becomes the signal Sg with the output signal Sg of the sensor 11-1 being non-inverted, and the output signal of the switch 13-4 becomes a signal −Sm with the output signal Sm of the sensor 11-4 being inverted. Accordingly, the output signals of the switches 13-1 and 13-4 result in the output signals Sg and Sm of the sensors 11-1 and 11-4 multiplied by factors of +1 and −1, respectively.

Accordingly, it is supposed that during the first period T1, the signal inverting unit 13 outputs the output signals which are subjected to combining operation by the combination unit 14 such that the measuring unit 15 outputs the output signal, which is assumed to be P1. Similarly, it is supposed that, during the second period T2, the measuring unit 15 outputs the output signal, which is assumed to be P2. Then, the output signals P1 and P2 of the measuring unit 15 are given as follows.

$$P1 = Sg + Sm \quad (22)$$

$$P2 = Sg - Sm \quad (23)$$

From these two equations, the output signals Sg' and Sm' of the sensors 11-1 and 11-4 can be inversely obtained by the computing unit 16 and, more particularly, can be expressed as follows.

$$Sg' = (P1 + P2)/2 \quad (24)$$

$$Sm' = (P1 - P2)/2 \quad (25)$$

Next, the operation of embodiment 2 will be described with reference to FIG. 10 in consideration of the foregoing description.

Figure 10:
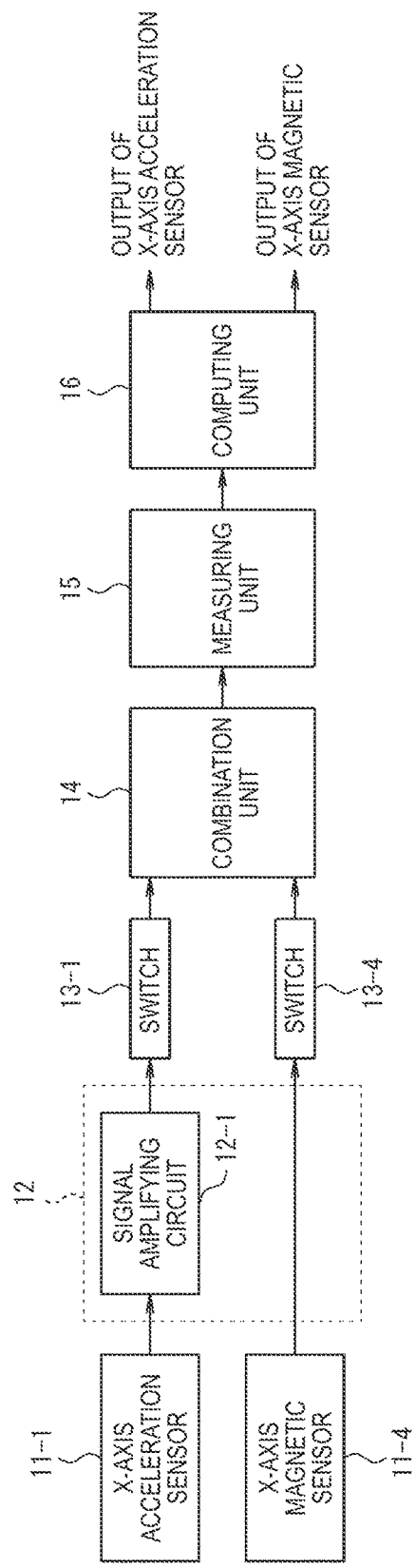
FIG. 10 is a block diagram illustrative of a configuration example of embodiment 2, illustrated in FIG. 6, in which a part is extracted with this configuration example being correlated to embodiment 2 according to the present invention.

FIG. 10 is a block diagram for processing only the output signals of the X-axis acceleration sensor 11-1 and the X-axis magnetic sensor 11-4 in FIG. 6 and differs from FIG. 8 in that the signal amplifying unit 12 is further provided.

Figure 11:
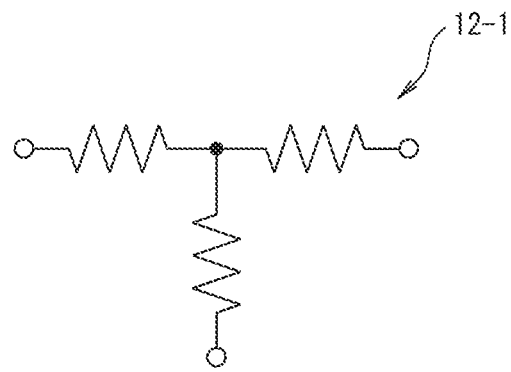
FIG. 11 is a circuit diagram illustrative of a configuration example of a signal amplifying circuit of FIG. 10.

The signal amplifying unit 12 of FIG. 10 includes a signal amplifying circuit 12-1. The signal amplifying circuit 12-1 includes, for example, an attenuator or the like as illustrated in FIG. 11. It is supposed that a signal level of the signal amplifying circuit 12-1 has an amplification rate of $1/\alpha$ (provided $\alpha>=1$).

As to the signal amplifying unit 12 illustrated in FIG. 10, the output signal of the X-axis acceleration sensor 11-1 is amplified by the signal amplifying circuit 12-1 and input to the switch 13-1. In addition, the output signal of the X-axis magnetic sensor 11-4 is input without change to the switch 13-4.

In case of embodiment 2 of FIG. 10, therefore, referring to the equations (22) and (23), the output signals P1 and P2 of the measuring unit 15 are expressed as follows.

$$P1=(Sg/\alpha)+Sm \quad (22A)$$

$$P2=(Sg/\alpha)-Sm \quad (23A)$$

From these two equations, the computing unit 16 is capable of obtaining the output signals Sg' and Sm' of the sensors 11-1 and 11-4, which are expressed as follows upon referring to the equations (24) and (25).

$$Sg'=(\alpha/2)\times(P1+P2)/2 \quad (24A)$$

$$Sm'=(\tfrac{1}{2})\times(P1-P2)/2 \quad (25A)$$

Moreover, the foregoing description has been made for processing only the output signals of the X-axis acceleration sensor 11-1 and the X-axis magnetic sensor 11-4. However, the same description will be exactly made even for the Y-axis acceleration sensor 11-2 and the Y-axis acceleration sensor 11-5, and the Z-axis magnetic sensor 11-3 and the Z-axis acceleration sensor 11-6. In addition, as described above, the type of the sensors may not be two types and may be any types while the number of the sensors may not be two and may include any number.

(Studies on SN Ratio)

Next, an SN ratio of embodiment 2 illustrated in FIG. 10 will be studied with reference to Comparative Examples 1 to 3.

(SN Ratios of Comparative Examples)

Figure 14:
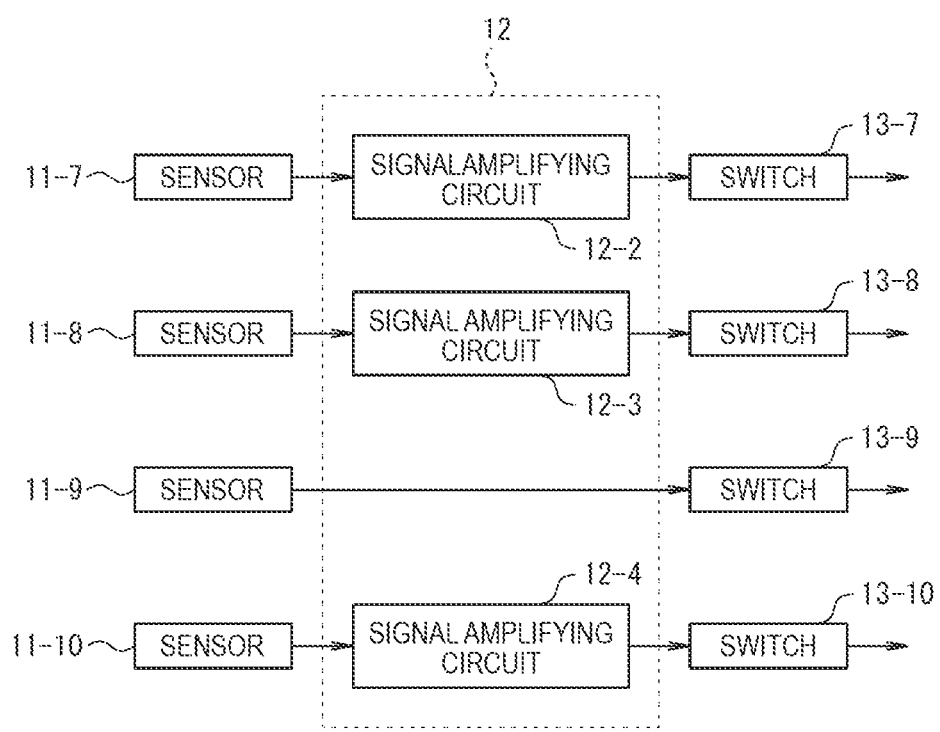
FIG. 14 is a block diagram of a modification to embodiment 2 according to the present invention.

First, a measuring system for a sensor signal subjected to the time-sharing process, as illustrated in FIG. 14, is assumed to be Comparative Example 1 and an SN ratio of such Comparative Example 1 will be studied.

Figure 12:
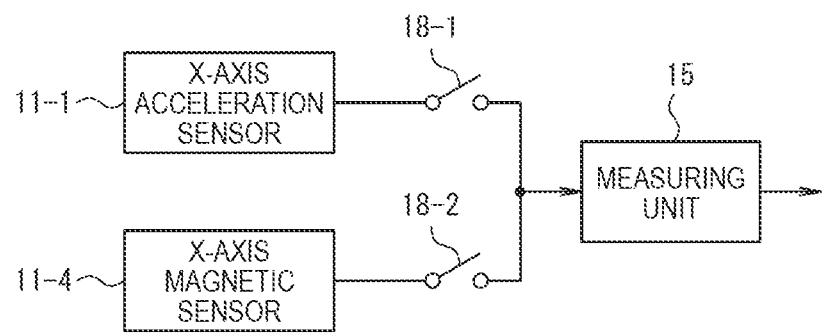
FIG. 12 is a timing chart for illustrating comparative example 1.

As illustrated in FIG. 12, the measuring system, related to Comparative Example 1, includes sensors 11-1 and 11-4, switches 18-1 and 18-2, and the measuring unit 15. With the switches 18-1 and 18-3 being turned on, the output signals Sg and Sm of the sensors 11-1 and 11-4 are input to the measuring unit 15 in time sharing such that these signals are output from the measuring unit 15 as the output signals Sg' and Sm'.

Here, it is supposed that the sensor 11-1 illustrated in FIG. 12 has sensor noise of $\pm Ng$ and the sensor 11-4 has sensor noise of $\pm Nm$. Moreover, none of the switches 18-1 and 18-4 generates noise but it is common practice for the measuring unit 15 to generate noise mainly on a signal amplifier (such as an operating amplifier), and hence, this noise is assumed to be $\pm Na$.

The output signals Sg', Sm' of the measuring unit 15, when including such noises, are given as follows.

$$Sg'=Sg\pm Ng\pm Na \quad (26)$$

$$Sm'=Sm\pm Nm\pm Na \quad (27)$$

According to Comparative Example 1 illustrated in FIG. 12, due to the time-sharing process, a final output of the X-axis acceleration sensor 11-1 has an SN ratio determined only by the respective values of the acceleration sensors and noise Na of the measuring unit 15 in common to the X-axis magnetic sensor 11-4. Likewise, an SN ratio of a final output of the X-axis magnetic sensor 11-4 is determined only by the respective values of the magnetic sensors and noise Na of the measuring unit 15. According to Comparative Example 1 illustrated in FIG. 12, thus, a circumstance under which the SN ratios of the respective sensors are large or small is reflected directly over a result in which the SN ratio of the final output is large or small.

Next, an SN ratio of Comparative Example 2 will be studied with the measuring system illustrated in FIG. 8 taken as Comparative Example 2.

It is supposed that in FIG. 8, sensor noise of the sensor 11-1 is $\pm Ng$ and sensor noise of the sensor 11-4 is $\pm Nm$. Although none of the switches 13-1, 13-4 or the combination unit 14 generates noise, moreover, it is supposed that noise of the measuring unit 15 is $\pm Na$.

Therefore, the output signals P1, P2 of the measuring unit 15 including noise are expressed as follows by referring to the equations (22) and (23).

$$P1=Sg+Sm\pm Ng\pm Nm\pm Na \quad (28)$$

$$P2=Sg-Sm\pm Ng\pm Nm\pm Na \quad (29)$$

Here, assuming that all of respective noises are white noises (i.e., a noise vector having no dependence on frequency) which are independent from each other, the equations (28) and (29) are written as follows.

$$P1=Sg+Sm\pm\sqrt{(Ng^2+Nm^2)}\pm Na$$

$$P2=Sg-Sm\pm\sqrt{(Ng^2+Nm^2)}\pm Na \quad \text{(Expression 8)}$$

Substituting both the equations of "Expression 8" in the equations (24) and (25), the output signals Sg', Sm' of the computing unit 16 of the measuring system of FIG. 8 are given as follows based on the same assumption as that mentioned above.

$$Sg' = Sg \pm \sqrt{\left(\frac{Ng^2 + Nm^2}{2}\right)} \pm \frac{Na}{\sqrt{2}} \quad \text{(Expression 9)}$$

$$Sm' = Sm \pm \sqrt{\left(\frac{Ng^2 + Nm^2}{2}\right)} \pm \frac{Na}{\sqrt{2}}$$

Comparative Example 2, from which "Expression 9" is obtained, will be studied on an assumption given to sensitivities and noises of the respective sensors as follows.

Sensor Sensitivity (X-axis of Acceleration Sensor)>
Sensor Sensitivity (X-axis of Magnetic Sensor)

Sensor Noise (X-axis of Acceleration Sensor)=Sensor Noise (X-axis of Magnetic Sensor)

Under such an assumption, the SN ratios of both sensors have the magnitude relationships expressed as follows.

SN Ratio of Sensor (X-axis of Acceleration Sensor)>
SN Ratio of Sensor (X-axis of Magnetic Sensor)

This assumption does not mean a specified case and frequently appears on, for example, the six-axis electronic compass described above. To describe in more detail, there are cases in which the acceleration sensor has a relatively large sensor output relative to 1G (i.e., gravity acceleration of 9.8 m/s/s in general), whereas the magnetic sensor has a relatively small sensor output relative to 50 µT (with µT, micro Tesla, corresponding to the magnitude of earth's magnetic field at Tokyo).

In actual applications, however, there are cases in which the six-axis electronic compass is desired to be applied to a pedometer using a three-axis acceleration sensor and a magnetic compass using a three-axis magnetic sensor. In such cases, there are needs in which the SN ratio of the acceleration sensor is not so high, whereas the SN ratio of the magnetic sensor is desired to be as high as possible. To satisfy such needs, accordingly, it is necessary to have a technique to relatively inverse the SN ratios of both the sensors in signal processing methods of the sensors.

A study will be conducted firstly as to an SN ratio occurring when the six-axis electronic compass is subjected to the time-sharing process in Comparative Example 1 illustrated in FIG. 12.

In order to simplify the consideration, here, it is supposed that noises of the acceleration sensor and the magnetic sensor which are placed equally are ±Ns and noise ±Na of the measuring unit 15 is ignored (i.e., Na=zero). From the equations (26) and (27), the output signals Sg', Sm' of the measuring unit 15 of FIG. 14 are given as follows.

$$Sg'=Sg\pm Ng=Sg\pm Ns \quad (30)$$

$$Sm'=Sm\pm Nm=Sm\pm Ns \quad (31)$$

Therefore, the SN ratios of both sensors are respectively given as follows.

$$\text{Sensor SN ratio (X-axis acceleration sensor)}=Sg/Ns \quad (32)$$

$$\text{Sensor SN ratio (X-axis magnetic sensor)}=Sm/Ns \quad (33)$$

Accordingly, the SN ratios of both sensors have a magnitude relationship that remains under the above-noted assumption, as expressed as follows.

Sensor SN ratio (X-axis acceleration sensor)>Sensor SN ratio (X-axis magnetic sensor)

For this reason, in Comparative Example 1 of FIG. 12, a sensitivity ratio Sg:Sm of both sensors 11-1 and 11-4 appears without change as a ratio between the SN ratios of the sensor outputs subsequent to the execution of signal processing.

Next, the SN ratios of the sensors 11-1 and 11-4 of Comparative Example 2 of FIG. 8 mentioned above will be studied. Suppose that noise ±Na (i.e., Na=zero) of the measuring unit 15 is ignored in the same manner as that mentioned above, and the output signals Sg' and Sm' of the measuring unit 15 of FIG. 8 can be simplified based on the above "Expression 9" as follows.

$$Sg' = Sg \pm \sqrt{\left(\frac{Ns^2 + Ns^2}{2}\right)} \pm \frac{O}{\sqrt{2}} = Sg \pm Ns \quad \text{(Expression 10)}$$

$$Sm' = Sm \pm \sqrt{\left(\frac{Ns^2 + Ns^2}{2}\right)} \pm \frac{O}{\sqrt{2}} = Sm \pm Ns$$

Both equations of "Expression 10" are similar to the case of the equations (30) and (31) representing the output signals Sg' and Sm' of the measuring unit 15 of FIG. 12.

Accordingly, the same results as those of the SN ratios of the sensors of Comparative Example 1 illustrated in FIG. 14 can be derived, also as to the SN ratios of the sensors 11-1 and 11-4 of Comparative Example 2 illustrated in FIG. 8 (see the equations (32) and (33)).

The studies heretofore can be summarized as follows.

According to Comparative Example 1 illustrated in FIG. 12 and Comparative Example 2 illustrated in FIG. 8, in any of these cases, the two sensors 11-1 and 11-4 have sensitivities with a difference in the magnitude relationship. Such a difference in the magnitude relationship is reflected directly over the SN ratio subsequent to the signal processing. Accordingly, the magnitude relationship between the SN ratios cannot be inversed in Comparative Example 1 illustrated in FIG. 12 and Comparative Example 2 illustrated in FIG. 8.

In order to address such an issue, it is conceivable for a dedicated signal processing circuit to be additionally provided for a sensor (i.e., a magnetic sensor in the six-axis electronic compass) for which there is a need to have an increased SN ratio subsequent to the signal processing. Alternatively, it is conceivable to extend a signal acquiring period. With such techniques, however, new issues will arise with an increase in the circuit size and an increase in the electric power consumption.

According to embodiment 2, therefore, the above issue is tried to be addressed by the provision of the signal amplifying unit 12, as illustrated in FIG. 6 or FIG. 10.

In this manner, according to embodiment 2 of the present invention, the signal amplifying unit 12 is provided as illustrated in FIG. 6 or FIG. 10. Hereinafter, a description will be given of the technical significance of the provision of the signal amplifying unit 12.

Firstly, the signal amplifying unit 12 illustrated in FIG. 10 is interposed (i.e., added) between the sensors 11-1 and 11-4 and the switches 18-1 and 18-2 in Comparative Example 1 illustrated in FIG. 12. This is regarded to be Comparative Example 3 and an SN ratio of this Comparative Example 3 is studied. In this situation, the noise of the signal amplifying unit 12 is generally extremely small to be ignored.

In this case, when using the equations (26) and (27), the output signals Sg' and Sm' of the measuring unit 15 are given as follows.

$$Sg' = \frac{Sg \pm Ng}{\alpha} \pm Na \quad \text{(Expression 11)}$$

$$Sm' = Sm \pm Nm \pm Na$$

Suppose that the above Expression is assumed that noises of the acceleration sensor and the magnetic sensor are equal to ±Ns and that the noise ±Na of the measuring unit 15 is ignored (i.e., Na=zero), it turns out as follows.

$$Sg'=(Sg\pm Ns)/\alpha \quad (34)$$

$$Sm'=Sm\pm Ns \quad (35)$$

The equations (34) and (35) have the SN ratios that are not different from the SN ratios derived from the equations (30) and (31). Therefore, as in Comparative Example 3, even if the signal amplifying circuit 12 illustrated in FIG. 10 is simply added to Comparative Example 1 illustrated in FIG. 12, the SN ratios cannot be inversed.

(SN Ratio of Embodiment 2)

Next, the SN ratio occurring when subjected to the signal processing described above in embodiment 2 illustrated in FIG. 10 will be studied. Here, the noise of the signal amplifying unit 12 is extremely small in general to be ignored.

In this case, the output signals P1 and P2 of the measuring unit 15 including noises are expressed as follows by referring to the equations (28) and (29) and two equations of the "Expression 8".

$$P1 = \frac{Sg}{\alpha} + Sm \pm \left(\frac{Ng}{\alpha}\right) \pm Nm \pm Na = \quad \text{(Expression 12)}$$

$$\frac{Sg}{\alpha} + Sm \pm \sqrt{\left[\left(\frac{Ng}{\alpha}\right)^2 + Nm^2\right]} \pm Na$$

$$P2 = \frac{Sg}{\alpha} - Sm \pm \left(\frac{Ng}{\alpha}\right) \pm Nm \pm Na =$$

$$\frac{Sg}{\alpha} - Sm \pm \sqrt{\left[\left(\frac{Ng}{\alpha}\right)^2 + Nm^2\right]} \pm Na$$

By substituting both of the equations of "Expression 12" in the equations (24) and (25), the output signals Sg' and Sm' of the computing unit 16 of the measuring system of FIG. 10 are given as follows.

$$Sg' = \frac{Sg}{\alpha} \pm \sqrt{\left[\frac{(Ng/\alpha)^2 + Nm^2}{2}\right]} \pm \frac{Na}{\sqrt{2}} \quad \text{(Expression 13)}$$

$$Sm' = Sm \pm \sqrt{\left[\frac{(Ng/\alpha)^2 + Nm^2}{2}\right]} \pm \frac{Na}{\sqrt{2}}$$

Both of the equations indicated in this "Expression 13" are complex, and hence, are simplified in the same manner as that previously performed. That is, suppose that the acceleration sensor and the magnetic sensor have noises equal to each other to be ±Ns and the noise ±Na of the measuring unit 15 is ignored (i.e., Na=zero), this gives the following expressions.

$$Sg' = \frac{Sg}{\alpha} \pm \sqrt{\left[\frac{(Ns/\alpha)^2 + Ns^2}{2}\right]} \pm \frac{0}{\sqrt{2}} = \quad \text{(Expression 14)}$$

$$\frac{Sg}{\alpha} \pm Ns \cdot \sqrt{\frac{(1/\alpha)^2 + 1}{2}}$$

$$Sm' = Sm \pm \sqrt{\left[\frac{(Ns/\alpha)^2 + Ns^2}{2}\right]} \pm \frac{0}{\sqrt{2}} =$$

$$Sm \pm Ns \cdot \sqrt{\frac{(1/\alpha)^2 + 1}{2}}$$

Accordingly, all of the SN ratios of Comparative Examples 1 to 3 are invariant prior to or subsequent to the signal processing, whereas in embodiment 2, noises vary as expressed below, respectively.

That is, the X-axis acceleration sensor 11-1 has noise that varies as expressed below.

(Comparative Example) → (Expression 15)

$$(\text{Present Method}) \pm \frac{Ns}{\alpha} \to \pm Ns \cdot \sqrt{\frac{(1/\alpha)^2 + 1}{2}}$$

Further, the X-axis magnetic sensor 11-4 has noise that varies as expressed below.

(Comparative Example) → (Expression 16)

$$(\text{Present Method}) \pm Ns \to \pm Ns \cdot \sqrt{\frac{(1/\alpha)^2 + 1}{2}}$$

On the other hand, according to embodiment 2, when comparing the equations (34) and (35) to both of the equations of the "Expression 14", the respective signal components of both of the sensors are invariant. Consequently, allowing the SN ratio in Comparative Example 1 to be standardized as 1, the SN ratios of the respective sensors of embodiment 2 vary after the signal processing in accordance with embodiment 2 as expressed below.

That is, the SN ratio of the X-axis acceleration sensor 11-1 has a variation (i.e., supposed to be SNg) to be described below.

$$SNg = \sqrt{\frac{2}{\alpha^2 + 1}} \text{ -- times} \quad \text{(Expression 17)}$$

Further, the SN ratio of the X-axis magnetic sensor 11-4 has a variation (i.e., supposed to be Smg) to be expressed below.

$$SNm = \sqrt{\frac{2\alpha^2}{\alpha^2 + 1}} \text{ -- times} \quad \text{(Expression 18)}$$

The relationship $\alpha >= 1$ is satisfied as previously assumed, and the respective change values indicated in "Expression 17" and "Expression 18" have the following magnitude relationships.

$$SNg <= 1 \quad (36)$$

$$SNm >= 1 \quad (37)$$

In embodiment 2, accordingly, the SN ratio of the X-axis acceleration sensor 11-1 is deteriorated as compared to Comparative Examples 1 to 3, but the SN ratio of the X-axis magnetic sensor 11-4 is improved.

According to embodiment 2, as described above, the signal amplifying unit 12 is provided as illustrated in FIG. 6 or FIG. 10, and the signal processing is performed as described above. This makes it possible to create a magnitude relationship of the SN ratio opposite to the magnitude relationship of the SN ratio of the sensor.

More particularly, in view of SNg/SNm=1/α from both of the equations illustrated in "Expression 17" and "Expression 18", when the SN ratios of the sensors have a difference of α times and the signal amplifying unit 12-1 is made to have an amplification rate of 1/α times, both of the SN ratios are equalized after the signal processing.

In addition, in embodiment 2, it becomes possible to arbitrarily set the amplification rate of the signal amplifying unit 12-1. Hence, if, for example, 1/β times (provided α<β) is set, the magnitude relationship of the SN ratios of the sensors per se can be inverted after the signal processing.

More particularly, further, applying embodiment 2 to the six-axis electronic compass gives the following description.

It is supposed that the SN ratio (i.e., a result from the sensor output relative to 1G divided by the noise of the acceleration sensor) is $\gamma(\gamma>=1)$ times the SN ratio (i.e., a result from the sensor output relative to 50 uT divided by the noise of the magnetic sensor) of the magnetic sensor.

Meanwhile, when embodiment 2 is applied to the pedometer using the three-axis acceleration sensor and the magnetic compass using the three-axis magnetic sensor respectively, the SN ratio of the magnetic compass inversely needs to be $\eta$ times ($\eta>=1$) of the SN ratio of the pedometer. Under such a case, the amplification rate of the signal amplifying unit 12-1, processed for the acceleration sensor, is set to $1/\beta$ times=$1/(\gamma\eta)$ times. Subsequently, the technique of the signal processing from the signal inverting unit 13 to the computing unit 16 is usable.

In the example of FIG. 10, further, although the signal amplifying unit 12 has been described with reference to one example that includes the signal amplifying circuit 12-1, it can be configured with another element.

Furthermore, in the example of FIG. 10, although the signal amplifying unit 12 has been described with reference to the case where the amplification rate is set to $1/\alpha$ times (where $\alpha>=1$) for the sensor that may have a reduced SN ratio after the signal processing. However, when the sensor, intended for the SN ratio to be inversely increased after the signal processing, is amplified by $\alpha$ times (where $\alpha>=1$), a signal amplifying circuit is adopted as a component element of the signal amplifying unit 12, so that the completely same effect being obtained in theory.

Moreover, the signal amplifying circuit is not provided for only one of the sensors, but the signal amplifying circuits may be preferably provided for both of the sensors.

Considering a case where embodiment 2 is embodied, except for a case where the sensor signal is extremely small, the use of a signal amplifying circuit (i.e., attenuation circuit) with an amplification rate less than 1.0 can be considered more preferable, instead of the use of a signal amplifying circuit with an amplification rate greater than 1.0. This is because the attenuation circuit has advantages, such as a smaller circuit size, less power consumption needed for the amplifying operation, and less noise than those of the signal amplifying circuit.

Although the foregoing description has been made for the case where the two sensors have equal noises (i.e., ±Ng=±Nm=±Ns), the present invention is applicable to sensors having not only same noise but also the same sensitivity, or to sensors of the same type in a further limited manner.

For example, the sensors A-1 and the sensor A-2 belong to the same type, and have sensitivities, noises and SN ratios all of which are equal. However, when the sensor A-1 is desired to have a higher SN ratio after the signal processing, the signal amplifying unit 12 may amplify the output signal of the sensor A-1 at an amplification rate greater than 1.0 time or amplify the output signal of the sensor A-2 at the amplification rate less than 1.0 time.

Further, the present invention is also applicable to a case where the two sensors have different noises, so that the substantially same conclusions as those previously noted above can be derived. Such conclusions are concretely represented by numeric values, which are illustrated in FIG. 13.

FIG. 13 illustrates a case where noises ±Ng and ±Nm of the sensors 1-1 and 1-4 are different such as ±Ng≠±Nm.

In practice, an arbitrary positive number is initially defined and an operation is performed to satisfy $|\pm Ng|/\alpha 2 = |\pm Nm|$. This operation is not a special one, and it is only necessary for the signal amplifying unit 12 described hereinabove to amplify or attenuate the output of the X-axis acceleration sensor. By performing such an operation, a subsequent signal processing method is performed in the exactly same manner. Hence, the subsequent calculations can be led in the exactly same manner.

Accordingly, $\alpha 1$, which is newly defined here, represents a parameter that serves the exactly same function as that of previous $\alpha$ and similarly has the magnitude expressed as $\alpha 1 >= 1$.

A final calculation result of the SN ratio of the sensor is indicated as illustrated in FIG. 13 and is supplemented as follows.

With the equation for the SN ratio of the magnetic sensor, previous $\alpha$ has been merely changed to $\alpha 1$ without changing any other parameters.

Additionally, $\alpha 2$ is not relied on. Accordingly, the assumption with $\alpha 1 >= 1$ surely increases the SN ratio.

Further, the SN ratio of the acceleration sensor tends to increase or decrease depending on the magnitude of $\alpha 2$, that is, the magnitude of original sensor noise. However, under a condition in which the original SN ratio of the acceleration sensor is greater than the original SN ratio of the magnetic sensor, a precondition is set based on the magnitude relationship of satisfying $\alpha 2 < \alpha 1$. Accordingly, it is unlikely that the SN ratio is infinitely minimized.

(Modification to Embodiment 2)

Next, a modification to embodiment 2 will be described with reference to FIG. 14.

According to the signal processing device of embodiment 2 illustrated in FIG. 10, the two types of (i.e., two) the acceleration sensor 11-1 and the magnetic sensor 11-4 have been described. This modification includes four types of sensors 11-7 to 11-10 which are replaced as illustrated in FIG. 14.

It is supposed that the four types of sensors 11-7 to 11-10 have the following relationships.

Sensor 11-7 . . . Original sensitivity is high with a high SN ratio.

Sensor 11-8 . . . Both of sensitivity and SN ratio are second highest.

Sensor 11-9 . . . Both of sensitivity and SN ratio are third highest.

Sensor 11-10 . . . Original sensitivity is lower than those of the above three types, and an amplifying circuit has to be provided in the vicinity of the sensor.

This modification causes the SN ratios of the sensors 11-7 to 11-10 to be nearly equalized after the signal processing and the signal amplifying unit 12 has a concrete configuration as illustrated in FIG. 14.

That is, in order to the most remarkably attenuating the output of the sensor 11-7, a signal amplifying circuit 12-2 having the greatest attenuation rate is interposed between the sensor 11-7 and the switch 13-7.

In order to attenuate the output of the sensor 11-8, a signal amplifying circuit 12-3 having a smaller attenuation rate than that of the signal amplifying circuit 12-2 is interposed between the sensor 11-8 and the switch 13-8. Next, when the signal amplifying circuit 12-2 has the attenuation rate of $1/\alpha 2$ and the signal amplifying circuit 12-3 has the attenuation rate of $1/\alpha 3$, the attenuation rate is set to satisfy $1 > 1/\alpha 3 > 1/\alpha 2$.

To attenuate the output of the sensor 11-10, a signal amplifying circuit 12-4 is interposed between the sensor 11-10 and the switch 13-10. The signal amplifying circuit 12-4 has an attenuation rate $\alpha 4$ that is set to be greater than 1.

An output of the sensor 11-9 is directly to the switch 13-9 without being subjected to attenuation or amplification.

Further, this modification has the same configuration as that of embodiment 2 illustrated in FIG. 6 except for the component parts illustrated in FIG. 14. Hence, its description is here omitted.

As will be apparent from this modification, the amplifying and attenuating functions of the signal amplifying unit 12 consistently exist for changing the relative SN ratios between the sensors. Consequently, it is wasteful to have a configuration such that all of the targeted sensors are attenuated or all of the targeted sensors are amplified. Therefore, it is a reasonable configuration to allow at least one sensor to transfer the sensor signal without change (i.e., with no amplification and attenuation) to a switch in its subsequent stage. In FIG. 14, the sensor 11-9 is selected for such a sensor signal.

Next, embodiment 3 according to the present invention will be described.

(Configuration of Embodiment 3)

Figure 15:
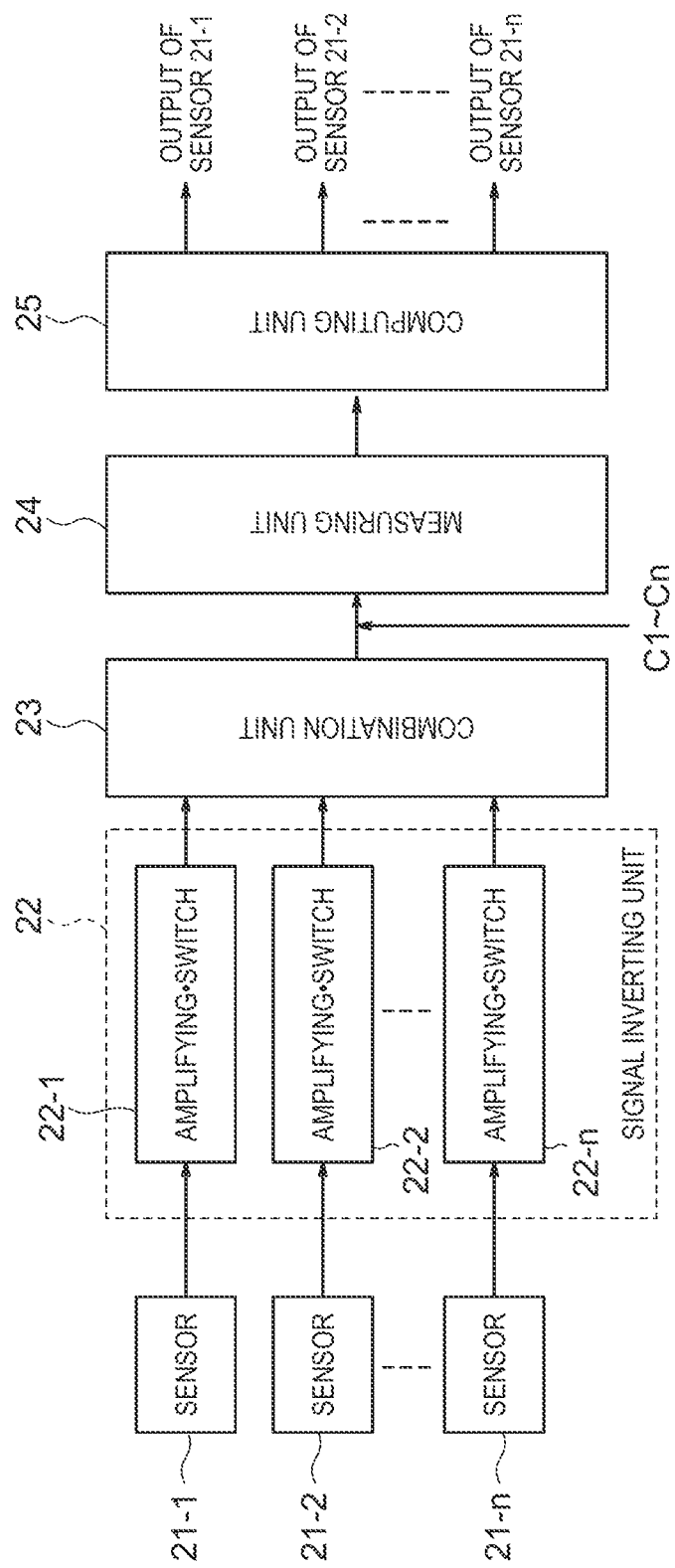
FIG. 15 is a block diagram illustrative of a configuration example of embodiment 3 of a signal processing device according to the present invention.

FIG. 15 is a block diagram illustrative of a configuration example of a signal processing device of embodiment 3 according to the present invention.

The signal processing device according to embodiment 3 includes n sensors 21-1 to 21-n, a signal inverting unit 22 having n amplifying switches 22-1 to 22-n, a combination unit 23, a measuring unit 24, and a computing unit 25. The signal inverting unit 22 has signal inverting functions as well as amplifying functions.

Then sensors 21-1 to 21-n convert physical quantities into electric signals, which are output as output signals, respectively. These sensors 21-1 to 21-n are not limited by their types and different sensors can be used. In the following description, it is supposed that the sensors 21-1 to 21-n include configurations, in which a sensitive part has both terminals provided with electrode terminals, respectively, that is, two-terminal type sensors.

The n amplifying switches 22-1 to 22-n are provided in conform to the n sensors 21-1 to 21-n. That is, the amplifying switches 22-1 to 22-n are connected to the associated sensors 21-1 to 21-n, respectively, and have the same functions. A concrete example of the signal inverting unit 22 will be described below.

The amplifying switches 22-1 to 22-n output respective output signals of the sensors 21-1 to 21-n. The combination unit 23 generates combined signals C1 to Cn with these output signals connected (or combined) in series or generates the combined signals C1 to Cn with these output signals connected (or combined) in parallel.

Here, when attempting for the sensor 21-1 to 21-n to include the two-terminal sensors, there are, for example, a voltage output type and a current output type. Therefore, when the sensors 21-1 to 21-n are the voltage output types, respective output signals are combined in series to generate the combined signals. In case of the current output types, the respective output signals are combined in parallel to generate the combined signals.

Further, when the sensors 21-1 to 21-n are other output types such as, for example, capacity types or resistance types, it is only necessary to provide an electric circuit for converting these into voltages or currents.

The measuring unit 24 sequentially receives the combined signals C1 to Cn generated by the combination unit 23 in synchronization with the operation of the signal inverting section 22. The respective combined signals C1 to Cn are subjected to a predetermined process, such as amplification or AD conversion.

The measuring unit 24 receives the combined signals C1 to Cn and performs a predetermined process, and then the computing unit 25 linearly combines the received signals by performing a predetermined computation. Based on such linear combination, the predetermined computation is performed to acquire respective output signals of the sensors 21-1 to 21-n and the computation results are output.

The computing process of the computing unit 25 for acquiring respective output values of the sensors 21-1 to 21-n may be realized by a CPU (Central Processing Unit) or software of a microcomputer.

Next, a concrete configuration of the sensors 21-1 to 21-n to the combination unit 23 of FIG. 15 will be described with reference to FIG. 16.

Figure 16:
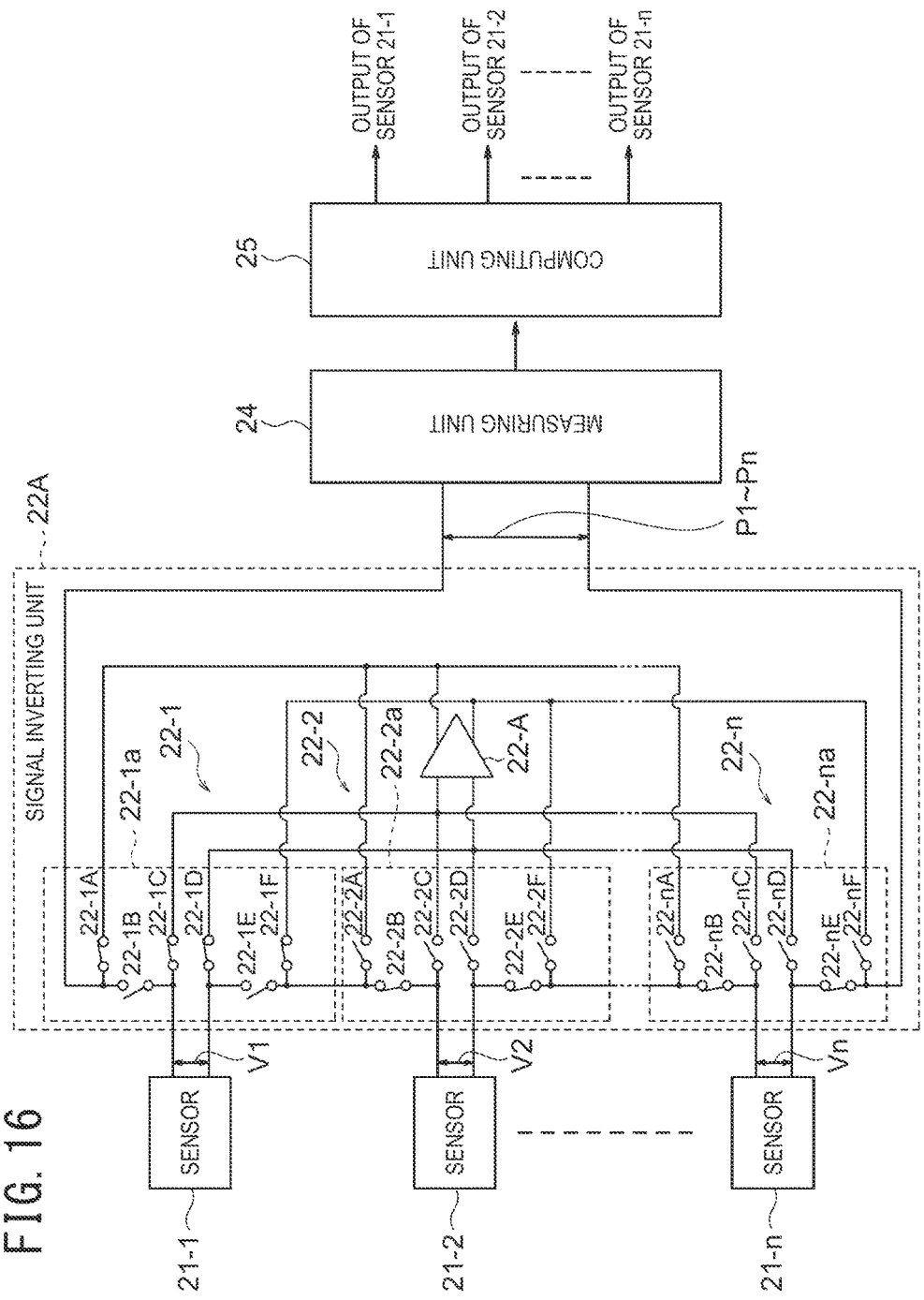
FIG. 16 is one example of a block diagram including a concrete circuit illustrative of a configuration in a case wherein embodiment 3, illustrated in FIG. 15, adopts sensors of voltage output types having two terminals.

FIG. 16 represents a configuration example of a case where the two-terminal voltage output type sensors are adopted as the sensors 21-1 to 21-n in embodiment 3 of FIG. 15.

As illustrated in FIG. 16, the signal processing device of embodiment 3 includes the n sensors 21-1 to 21-n, a signal inverting unit 22A, the measuring unit 24 and the computing unit 25.

According to embodiment 3, configurations corresponding to the signal inverting unit 22 and the combination unit 23 of embodiment 3, illustrated in FIG. 15, are embodied with the signal inverting unit 22A of FIG. 16.

As illustrated in FIG. 16, the signal inverting unit 22A includes the amplifying switches 22-1 to 22-n.

The amplifying switch 22-1 includes a switch group 22-1a and a common amplifier 22-A. The amplifying switch 22-2 includes a switch group 22-2a and the common amplifier 22-A. Likewise, the n-th switch group 22-n includes a switch group 22-na and the common amplifier 22-A.

The switch group 22-1a includes switches 22-1A to 22-1F and the switch group 22-2a includes switches 22-2A to 22-2F. Likewise, the switch group 22-na includes switches 22-nA to 22-nF.

The amplifier 22-A has an amplification rate of $-\alpha$ times. Among the output signals V1 to Vn of the n sensors 21-1 to 21-n, the outputs, selected by the switch group 22-1a, 22-2a ... 22-na, are inverted and amplified by the amplifier 22-A for generating inverted and amplified signals.

In the example of FIG. 16, here, although the n amplifying switches 22-1 to 22-n employ (i.e., share) the same amplifier 22-A, individual amplifiers may be provided.

The measuring unit 24 sequentially receives the n combining voltages (i.e., combined signals) P1 to Pn, generated by the signal inverting unit 22A in synchronization with the operation of the signal inverting unit 22A, and performs amplifications as well as AD conversions. To this end, although not illustrated, the measuring unit 24 is provided with an amplifying unit and an AD converting unit.

The computing unit 25 linearly combines the voltages P1 to Pn of output data output from the measuring unit 24 by a predetermined computation, and performs another predetermined computation, based on the predetermined computation, to obtain respective output values of the sensors 21-1 to 21-n and output computation results.

(Operation of Embodiment 3)

Next, an operation example of embodiment 3 will be described with reference to the accompanying drawings.

It is supposed that in FIG. 16, switching operations of the switch group 22-1a, 22-2a ... 22-na of the amplifying switches 22-1 to 22-n are performed in response to control signals from a control unit (not illustrated).

Figure 17:
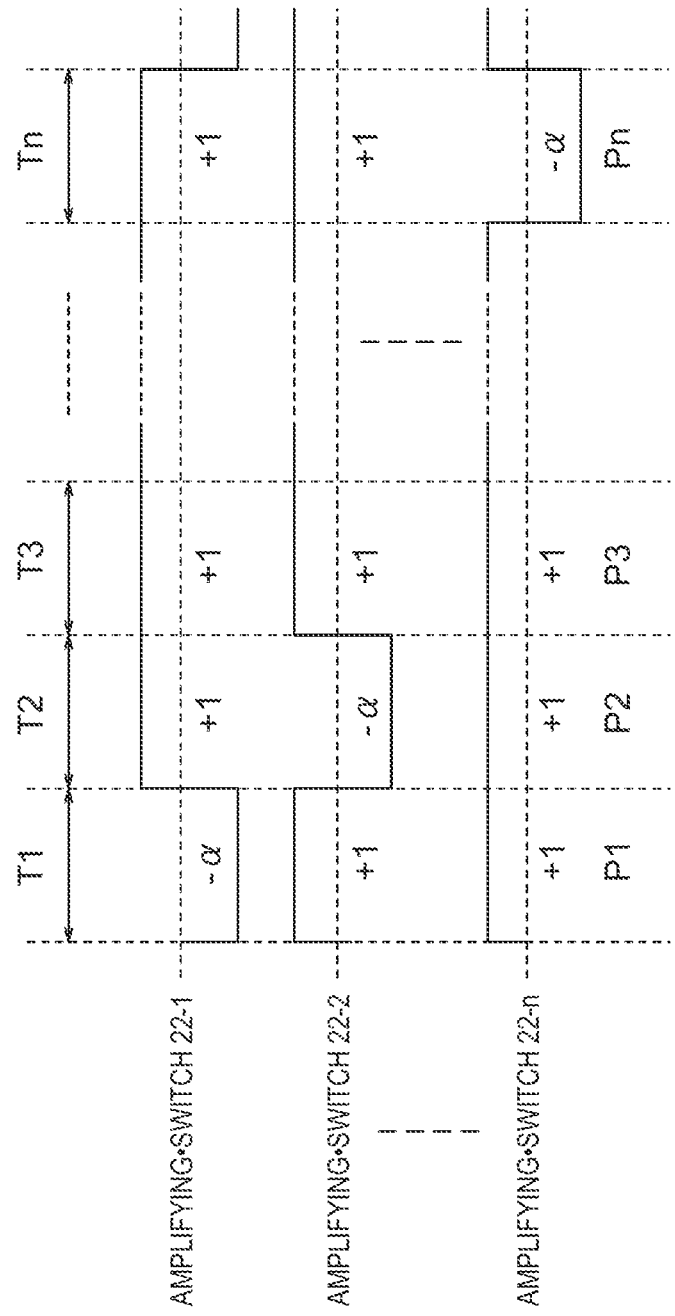
FIG. 17 is one example of a timing chart illustrative of how switches of a signal inverting unit perform switching operations in embodiment 3 illustrated in FIG. 15.

The switch group 22-1a, 22-2a ... 22-na of amplifying switches 22-1 to 22-n have first to n-th operating states in one cycle as illustrated in FIG. 17 and respective operations are performed during first to n-th periods T1 to Tn.

Firstly, in the first period T1, as to the switch group 22-1a, only the switches 22-1A, 22-1C, 22-1D, and 22-1F turn on. Moreover, as to the switch group 22-2a, only the switches 22-2B and 22-2E turn on. In addition, as to the switch group 22-na, only the switches 22-nB and 22-nE turn on. This allows the switches to fall in turn-on states as illustrated in FIG. 16.

Therefore, in the first period T1, only the output V1 of the sensor 21-1 is inverted and amplified by −α times by the amplifier 22-A to provide an inverted and amplified signal. The outputs V2 to Vn of the other sensors 21-2 to 21-n are not inverted or amplified to provide a non-inverted signal. Then, these signals are combined and the signal inverting unit 22A provides an output (−αV1+V2+ . . . +Vn).

Subsequently, in the period T2, in the switch group 22-1a, only the switches 22-1B, 22-1E turn on. Moreover, in the switch group 22-2a, only the switches 22-2A, 22-2C, 22-2D, and 22-2F turn on. Then, in the switch group 22-na, only the switches 22-Nb and 22-nE turn on.

Therefore, in the second period T2, the amplifier 22-A inverts and amplifies only the output V2 of the sensor 21-2 by −α times to provide an inverted and amplified signal. None of the respective outputs V1, V3 to Vn of the sensors other than that of the sensor 21-2 is inverted nor amplified to provide a non-inverted signal. Then, these signals are combined and the signal inverting unit 22A provides an output (V1−αV2+ . . . +Vn).

Likewise, in the n-th period Tn, in the switch group 22-1a, only the switches 22-1B and 22-1E turn on. Moreover, in the switch group 22-2a, only the switches 22-2B and 22-2E turn on. In the switch group 22-na, only the switches 22-nA, 22-nC, 22-nD, and 22-nF turn on.

Therefore, in the n-th period Tn, the amplifier 22-A inverts and amplifies only the output Vn of the sensor 1-n by −α times to provide an inverted and amplified signal. The outputs of the sensors, other than the sensor 1-n, is not inverted or amplified to provide a non-inverted signal. Then, these signals are combined and the signal inverting unit 22A provides an output (V1+V2+ . . . −αVn).

The switching operations of the amplifying switches 22-1 to 22-n in the first to n-th periods T1 to Tn are summarized as illustrated in FIG. 17.

Referring to FIG. 17, a voltage obtained by the amplifying switch 22-1 includes a voltage −αV1 that is −α times the output voltage V1 of the sensor 21-1 in the period T1, and in the other periods T2 to Tn, a non-inverted voltage V1 which is +1 times the output voltage V1 is obtainable.

Further, a voltage obtained by the amplifying switch 22-2 includes a voltage −αV2 that is −α times the output voltage V2 of the sensor 21-2 in the period T2, and in the other periods T1 and T3 to Tn, a non-inverted voltage V2 that is +1 times the output voltage V2 is obtainable.

Likewise, a voltage obtained by the amplifying switch 22-n includes a voltage −αV2 that is −α times the output voltage Vn of the sensor 21-n in the period Tn, and in the other periods, a non-inverted voltage Vn that is +1 times the output voltage Vn is obtainable.

In FIG. 17, when the respective voltages obtained by the amplifying switches 22-1 to 22-n include non-inverted voltages, "+1" is indicated, whereas when the voltage is a voltage of −α times, "−α" is indicated.

Accordingly, the respective output voltages P1 to Pn output from the signal inverting unit 22A in the period T1 to Tn as described above are given as follows.

$$P1 = -\alpha V1 + V2 + V3 + \ldots + Vn \quad (38\text{-}1)$$

$$P2 = V1 - \alpha V2 + V3 + \ldots + Vn \quad (38\text{-}2)$$

$$P3 = V1 + V2 - \alpha V3 + \ldots + Vn \quad (38\text{-}3)$$

$$\ldots$$

$$Pn = V1 + V2 + V3 + \ldots - \alpha Vn \quad (38\text{-}n)$$

From these n equations, it becomes possible for the computing unit 25 to inversely acquire the output voltages V1 to Vn of the sensors 21-1 to 21-n. In particular, these are given as follows.

$$V1 = \frac{1}{\beta} \cdot [(\alpha - n + 2)P1 + P2 + P3 + \ldots + Pn] \quad (39\text{-}1)$$

$$V2 = \frac{1}{\beta} \cdot [P1 + (\alpha - n + 2)P2 + P3 + \ldots + Pn] \quad (39\text{-}2)$$

$$V3 = \frac{1}{\beta} \cdot [P1 + P2 + (\alpha - n + 2)P3 + \ldots + Pn] \quad (39\text{-}3)$$

$$\ldots$$

$$Vn = \frac{1}{\beta} \cdot [P1 + P2 + P3 + \ldots + (\alpha - n + 2)Pn] \quad (39\text{-}n)$$

where $\beta = -\alpha^2 + (n-2)\alpha + n - 1$.

In embodiment 3, accordingly, it becomes possible to calculate all of the respective output signals of the n sensors 21-1 to 21-n.

For example, when n is equal to 6, the output voltages P1 to P6 of the signal inverting unit 2A are given as follows.

$$P1 = -\alpha V1 + V2 + V3 + V4 + V5 + V6 \quad (40\text{-}1)$$

$$P2 = V1 - \alpha V2 + V3 + V4 + V5 + V6 \quad (40\text{-}2)$$

$$P3 = V1 + V2 - \alpha V3 + V4 + V5 + V6 \quad (40\text{-}3)$$

$$P4 = V1 + V2 + V3 - \alpha V4 + V5 + V6 \quad (40\text{-}4)$$

$$P5 = V1 + V2 - \alpha V3 + V4 - \alpha V5 + V6 \quad (40\text{-}5)$$

$$P6 = V1 + V2 + V3 + V4 + V5 - \alpha V6 \quad (40\text{-}6)$$

From these equations, the output voltages V1 to V6 of the sensors 21-1 to 21-6 are given as follows.

$$V1 = 1/\beta \cdot [(\alpha - 4)P1 + P2 + P3 + P4 + P5 + P6] \quad (41\text{-}1)$$

$$V2 = 1/\beta \cdot [P1 + (\alpha - 4)P2 + P3 + P4 + P5 + P6] \quad (41\text{-}2)$$

$$V3 = 1/\beta \cdot [P1 + P2 + (\alpha - 4)P3 + P4 + P5 + P6] \quad (41\text{-}3)$$

$$V4 = 1/\beta \cdot [P1 + P2 + P3 + (\alpha - 4)P4 + P5 + P6] \quad (41\text{-}4)$$

$$V5 = 1/\beta \cdot [P1 + P2 + P3 + P4 + (\alpha - 4)P5 + P6] \quad (41\text{-}5)$$

$$V6 = 1/\beta \cdot [P1 + P2 + P3 + P4 + P5 + (\alpha - 4)P6] \quad (41\text{-}6)$$

where $\beta = -\alpha^2 + 4\alpha + 5$.

Next, a study will be conducted as to what extent the SN ratio is improved in embodiment 3 as compared to the general time-sharing process.

Figure 18:
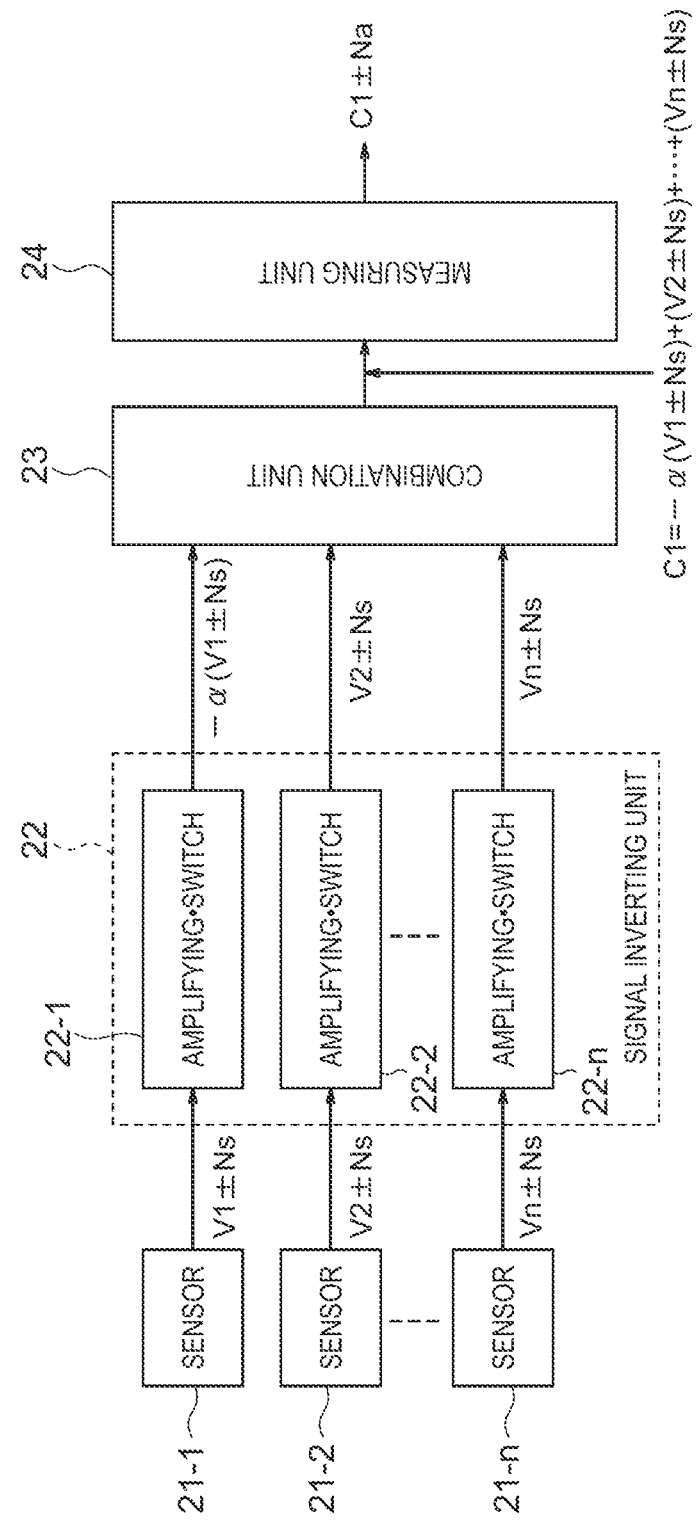
FIG. 18 is a block diagram of a case where noise is superimposed in embodiment 3 illustrated in FIG. 15 with a view to studying noise.

FIG. 18 represents a case where noises (i.e., disruptive sounds) are superimposed in the measuring system of FIG. 16 and at operation timings of FIG. 17. However, the illustrated embodiment 3 is based on FIG. 15.

It is supposed that such superimposed noises take noises at fixed values with respect to white noises, that is, for all frequency bands, and such noise values are designated as ±N. In addition, it is supposed that all of sensor noises of the n sensors 21-1 to 21-n have the same magnitudes ±Ns but are uncorrelated to each other.

Further, it is supposed that no noise is newly generated by the signal inverting unit 22 or the combination unit 23 but noises depending on sensor noises and amplification rates are output without change. On the other hand, it is supposed that measuring noises are newly generated by the amplifying unit or the AD converting unit of the measuring unit 24 and such measuring noises are set to ±Na.

As a result, output voltages (including noises) are obtained, as illustrated in FIG. 18.

Accordingly, the output voltages P1 to Pn including noises are expressed as follows by reference to the above equations (38-1) to (38-n).

$$P1 = -\alpha(V1 \pm Ns) + (V2 \pm Ns) + (V3 \pm Ns) + \ldots + (Vn \pm Ns) \pm Na \quad (42\text{-}1)$$

$$P2 = (V1 \pm Ns) - \alpha(V2 \pm Ns) + (V3 \pm Ns) + \ldots + (Vn \pm Ns) \pm Na \quad (42\text{-}2)$$

$$P3 = (V1 \pm Ns) + (V2 \pm Ns) - \alpha(V3 \pm Ns) + \ldots + (Vn \pm Ns) \pm Na \quad (42\text{-}3)$$

...

$$Pn = (V1 \pm Ns) + (V2 \pm Ns) + (V3 \pm Ns) + \ldots - \alpha(Vn \pm Ns) \pm Na \quad (42\text{-}n)$$

Here, the sensor noises of the sensors 21-1 to 21-n are uncorrelated to each other, and hence, the above n equations are simplified as follows.

$$P1 = -\alpha V1 + V2 + V3 + \ldots + Vn \pm \sqrt{(\alpha^2 + n - 1)} Ns \pm Na \quad (43\text{-}1)$$

$$P2 = V1 - \alpha V2 + V3 + \ldots + Vn \pm \sqrt{(\alpha^2 + n - 1)} Ns \pm Na \quad (43\text{-}2)$$

$$P3 = V1 + V2 - \alpha V3 + \ldots + Vn \pm \sqrt{(\alpha^2 + n - 1)} Ns \pm Na \quad (43\text{-}3)$$

...

$$Pn = V1 + V2 + V3 + \ldots - \alpha Vn \pm \sqrt{(\alpha^2 + n - 1)} Ns \pm Na \quad (43\text{-}n)$$

These n equations are computed in the same ways as those of V1 to Vn in the above equations (39-1) to (39-n). If the output V1 of the sensor 21-1 is desired to calculate, only $1/\beta \cdot [(\alpha-n+2)P1+P2+P3+ \ldots +Pn]$ should be calculated.

Further, the output voltages P1 to Pn are measured at different time periods, and therefore, sensor noises and measuring noise are basically uncorrelated to the measuring time periods with each other.

Accordingly, when considering the sensor noises and measuring noise, outputs V1' to Vn' of the respective sensors are given as follows.

$$V1' = V1 \pm \gamma/\beta \, (\eta Ns \pm Na) \quad (44\text{-}1)$$

$$V2' = V2 \pm \gamma/\beta \, (\eta Ns \pm Na) \quad (42\text{-}2)$$

$$V3' = V3 \pm \gamma/\beta \, (\eta Ns \pm Na) \quad (44\text{-}3)$$

...

$$Vn' = Vn \pm \gamma/\beta \, (\eta Ns \pm Na) \quad (44\text{-}n)$$

where β, γ, and η are given as follows.

$$\beta = -\alpha^2 + (n-2)\alpha + n - 1 \quad (45\text{-}1)$$

$$\gamma = \sqrt{[\alpha^2 + (-2n+4)\alpha + n^2 - 3n + 3]} \quad (45\text{-}2)$$

$$\eta = \sqrt{(\alpha^2 + n - 1)} \quad (45\text{-}3)$$

Basically, the amplification rate α of the amplifier 22-A may be determined by using the above equations (44-1) to (45-3) for the n sensors. In the following, the SN ratios are studied with reference to two concrete examples.

Concrete Example 1

Concrete example 1 demonstrates a case where the measuring noise is minimized when the number of sensors is 6.

That is, this is when n=6. Applying the foregoing calculations gives the following.

$$V1' = V1 \pm \gamma/\beta(\eta Ns \pm Na) \quad (46\text{-}1)$$

$$V2' = V2 \pm \gamma/\beta(\eta Ns \pm Na) \quad (46\text{-}2)$$

$$V3' = V3 \pm \gamma/\beta(\eta Ns \pm Na) \quad (46\text{-}3)$$

$$V4' = V4 \pm \gamma/\beta(\eta Ns \pm Na) \quad (46\text{-}4)$$

$$V5' = V5 \pm \gamma/\beta(\eta Ns \pm Na) \quad (46\text{-}5)$$

$$V6' = V6 \pm \gamma/\beta(\eta Ns \pm Na) \quad (46\text{-}6)$$

$$\beta = -\alpha^2 + 4\alpha + 5 \quad (47\text{-}1)$$

$$\gamma = \sqrt{(\alpha^2 - 8\alpha + 21)} \quad (47\text{-}2)$$

$$\eta = \sqrt{(\alpha^2 + 5)} \quad (47\text{-}3)$$

At this time, the case in which measuring noise representing the condition of Concrete example 1 is minimized means a case in that f6 is minimized when f6=γ/βa is positive (f6>=0) and falls within a range of α>=0.

As a result of differential calculations or numerical calculations or the like, it is demonstrated that f6 takes a minimum value of 0.30 when α≅1.21 is satisfied. At this time, β≅8.38, γ≅3.58, and η≅2.54 are satisfied.

Accordingly, when the amplification rate α of the amplifier 22-A is set to 1.21, the following equations are obtainable.

$$V1' \cong V1 \pm 1.09Ns \pm 0.30Na \quad (48\text{-}1)$$

$$V2' \cong V2 \pm 1.09Ns \pm 0.30Na \quad (48\text{-}2)$$

$$V3' \cong V3 \pm 1.09Ns \pm 0.30Na \quad (48\text{-}3)$$

$$V4' \cong V4 \pm 1.09Ns \pm 0.30Na \quad (48\text{-}4)$$

$$V5' \cong V5 \pm 1.09Ns \pm 0.30Na \quad (48\text{-}5)$$

$$V6' \cong V6 \pm 1.09Ns \pm 0.30Na \quad (48\text{-}6)$$

Referring to these equations (48-1) to (48-6), it turns out that when sensor noises ±Ns are negligibly small, the SN ratio is improved by 1/0.30 times, that is, approximately 3.3 times as compared to the general time-sharing process.

Concrete Example 2

Concrete example 2 demonstrates a case where sensor noises are minimized with the n sensors.

Calculating α in the above equations (45-1) to (45-3) for minimizing fn=γη/β, it is demonstrated that α=n/2−1, and further, a minimum value always satisfies fn=1 regardless of n.

In this case, accordingly, $\beta=n^2/4$, $\gamma=n/2$, and $\eta=n/2$ are satisfied and the equations (49-1) to (49-n) are given as follows.

$$V1' = V1 \pm Ns \pm (2/n)Na \qquad (49\text{-}1)$$

$$V2' = V2 \pm Ns \pm (2/n)Na \qquad (49\text{-}2)$$

...

$$Vn' = Vn \pm Ns \pm (2/n)Na \qquad (49\text{-}n)$$

That is, when sensor noises are reasonably large, setting to satisfy α=n/2−1 allows the SN ratios due to sensor noise to be same as those of the time-sharing process. Further, the SN ratios due to measuring noise can be improved by n/2 times.

In light of the foregoing studying results, regardless of the number of the sensors, when embodiment 3 (i.e., the measuring system) according to the present invention is provided and the same calculations as those discussed above are performed, and the amplification rate α of the amplifier 22-A is calculated, it becomes possible to configure an optimum signal processing device (with the highest SN ratio).

Meanwhile, the sensor noises and measuring noise can be arbitrarily set. Hence, if the sensor noises are relatively small, Concrete example 1 is recommended, whereas if they are relatively large, Concrete example 2 is recommended.

As a matter of course, however, even if the noises in combination of sensor noises and measuring noise are minimized, it is needless to say that the same procedures as those of the foregoing calculations can be set.

Next, embodiment 4 according to the present invention will be described.

Embodiment 4 is directed to a signal processing device suited for a case where resistance type sensors are used as the sensors.

(Configuration of Embodiment 4)

Figure 19:
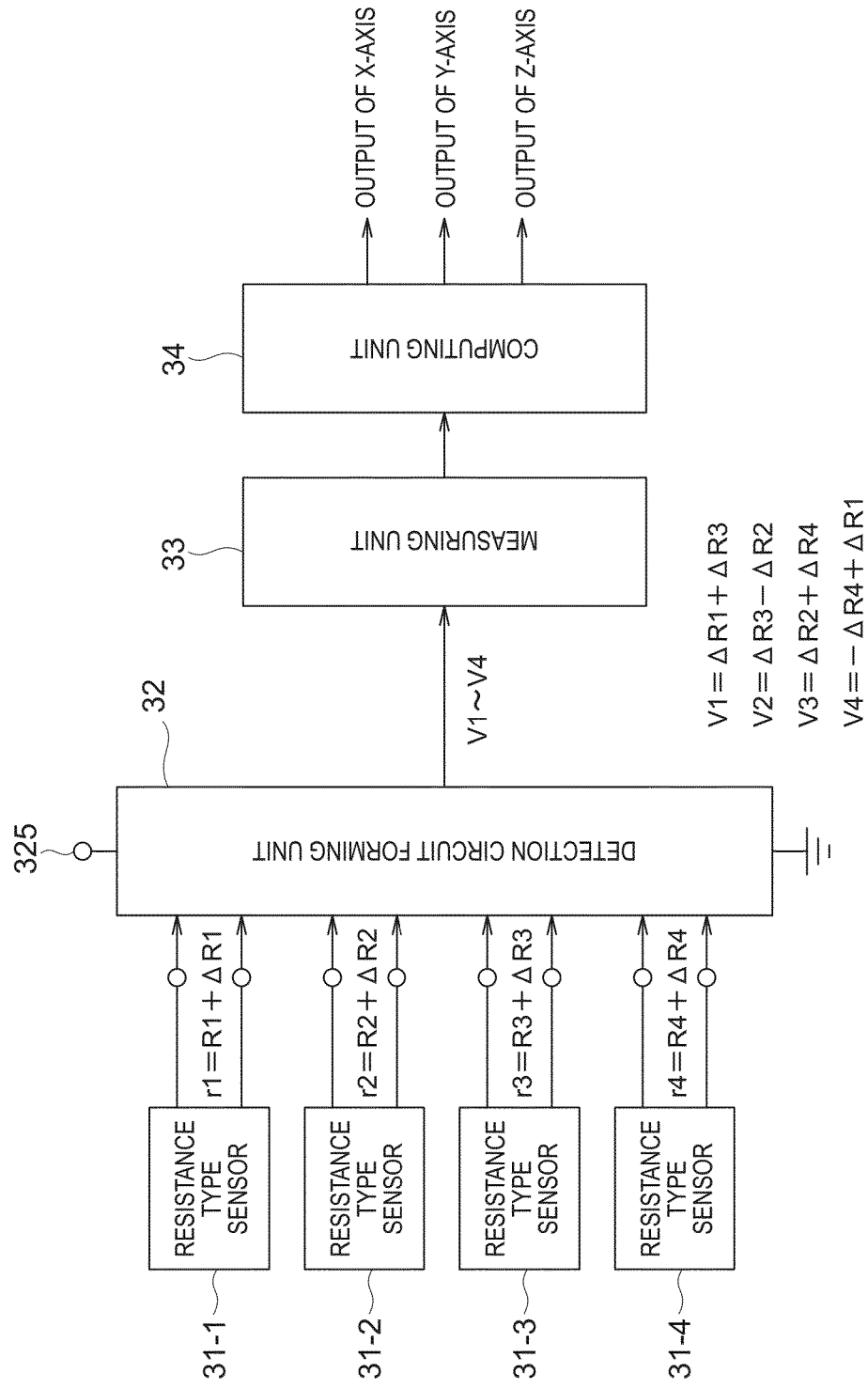
FIG. 19 is a block diagram illustrative of a configuration of embodiment 4 of a signal processing device according to the present invention.

FIG. 19 is a block diagram illustrative of a configuration example of the signal processing device of embodiment 4 according to the present invention.

As illustrated in FIG. 19, embodiment 4 includes four resistance type sensors 31-1 to 31-4, a detection circuit forming unit 32, a measuring unit 33, and a computing unit 34.

The four resistance type sensors 31-1 to 31-4 are capable of detecting changes in some physical quantities caused by changes in electrical resistance values, and such a definition follows a general institution of the resistance type sensors.

To described in more detail using mathematical expressions, it is supposed that R is a resistance value of the resistance type sensor having a physical quantity serving as a reference and ΔR is a change in the resistance value occurring when some physical quantities vary, and a whole resistance value r is given as r=R+ΔR.

Also, r and R represent the resistance values per se and surely take positive values (i.e., greater than 0) but ΔR may be either positive, negative, or zero.

In embodiment 4, the four resistance type sensors 1-1 to 1-4 are present and resistance values r1 to r4 of the resistance type sensors 31-1 to 31-4 can be expressed as follows.

$$r1 = R1 + \Delta R1 \qquad (50)$$

$$r2 = R1 + \Delta R2 \qquad (51)$$

$$r3 = R1 + \Delta R3 \qquad (52)$$

$$r4 = R1 + \Delta R4 \qquad (53)$$

In this case, it is supposed that changes in the resistance values r1 to r4 of the four resistance type sensors 31-1 to 31-4 occur due to changes in the physical quantities that are different from each other.

Further, the four resistance type sensors 31-1 to 31-4 may include output terminals as illustrated in FIG. 19.

The detection circuit forming unit 32 selects two predetermined resistance type sensors from the four resistance type sensors 31-1 to 31-4. As illustrated in FIG. 20A to FIG. 20D, predetermined resistance detection circuits 321 to 324 including such selected two resistance type sensors are sequentially formed or assembled.

For this reason, the detection circuit forming unit 32 includes reference resistors Rref (i.e., electric elements with no variations in the electrical resistance values due to the physical quantities), a power supply terminal 325, and plural switches (not illustrated) for connection between the selected resistance type sensors, connection to the power supply terminal 325, and connection to the ground (see FIG. 20A to FIG. 20D).

The detection circuit forming unit 32 sequentially performs respective operations of phases 1 to 4 in a period of one cycle for measuring the physical quantities, and forms the four resistance detection circuits 321 to 324 depending on such phases 1 to 4 as illustrated in FIG. 20A to FIG. 20D.

Figure 20A:
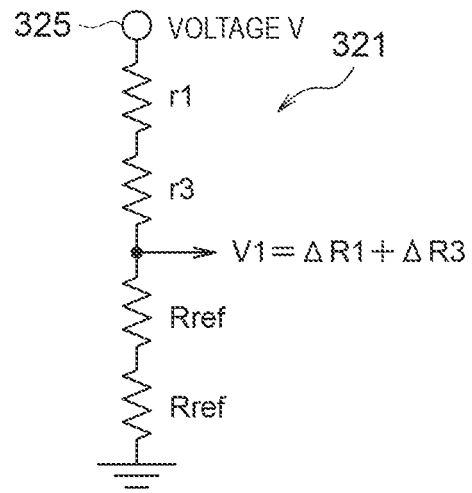
FIG. 20A is one example of a circuit diagram in a phase 1 of a resistance detection circuit formed in a detection circuit forming unit of FIG. 19.

In phase 1, as illustrated in FIG. 20A, the resistance detection circuit 321 is formed of a half-bridge circuit in which resistances r1 and r3 related to the resistance type sensors 31-1 and 31-3 and two resistances Rref for references are assembled.

Figure 20B:
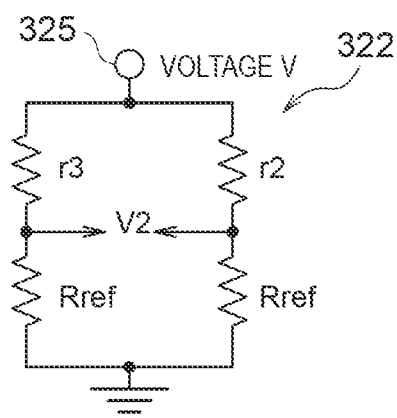
FIG. 20B is one example of a circuit diagram in a phase 2 of the resistance detection circuit formed in the detection circuit forming unit of FIG. 19.

In phase 2, as illustrated in FIG. 20B, the resistance detection circuit 322 is formed of a half-bridge circuit in which resistors r2 and r3 related to the resistance type sensors 31-2 and 31-3 and the two resistances Rref for references are assembled.

Figure 20C:
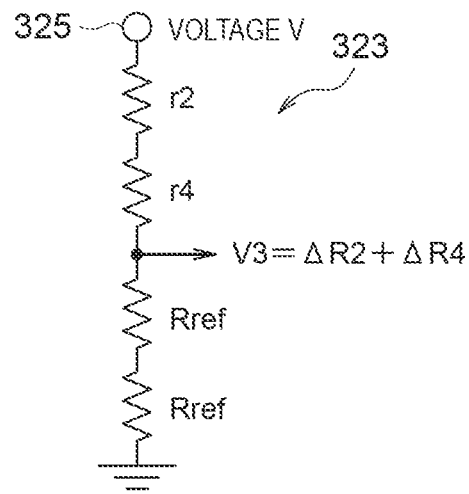
FIG. 20C is one example of a circuit diagram in a phase 3 of the resistance detection circuit formed in the detection circuit forming unit of FIG. 19.

In phase 3, as illustrated in FIG. 20C, the resistance detection circuit 323 is formed of a half-bridge circuit in which resistors r2 and r4 related to the resistance type sensors 31-2 and 31-4 and the two resistances Rref for references are assembled.

Figure 20D:
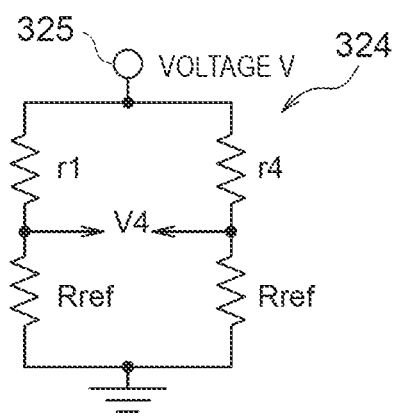
FIG. 20D is one example of a circuit diagram in a phase 4 of the resistance detection circuit formed in the detection circuit forming unit of FIG. 19.

In phase 4, as illustrated in FIG. 20D, the resistance detection circuit 324 is formed of a half-bridge circuit in which resistances r1 and r4 related to the resistance type sensors 31-1 and 31-4 and the two resistances Rref for references are assembled.

Next, respective output voltages V1 to V4 of the resistance detection circuits 321 to 324, formed in the phases 1 to 4, will be described with reference to FIG. 20A to FIG. 20D.

The output voltage V1 of the resistance detection circuit 321 in the phase 1 is expressed as follows (see FIG. 20A) when V is a voltage supplied to the power supply terminal 324.

$$V1 = \frac{2 \cdot Rref}{(r1 + r3) + 2 \cdot Rref} \cdot V \quad \text{(Expression 19)}$$

Here, if it is assumed that ΔR1 and ΔR3 are extremely smaller than R1, R3, and Rref, the Expression 19 can be expressed as follows.

$$V1 = \frac{2 \cdot Rref \cdot V}{(R1 + R3) + 2 \cdot Rref}\left[1 - \frac{\Delta R1 + \Delta R3}{(R1 + R3) + 2 \cdot Rref}\right] \quad \text{(Expression 20)}$$

Although this equation is somewhat complex, all of the quantities are fixed numbers except ΔR1 and ΔR3. It is supposed that A1 and B1 are fixed numbers, the output voltage V1 can be expressed by the following primary expression.

$$V1 = A1 - B1 \cdot (\Delta R1 + \Delta R3) \quad (54)$$

That is, the output voltage V1 of the resistance detection circuit 321 can be derived by measuring a voltage depending on a sum (i.e., a result of sum) of variations ΔR1 and ΔR3 of the resistance values of the resistances r1 and r3 of the resistance type sensors 31-1 and 31-3. Also, values of A1 and B1 can be arbitrarily set. Hence, by focusing on the variations of the voltages, the equation (54) can be expressed as the following equation (55).

$$V1 \propto \Delta R1 + \Delta R3 \quad (55)$$

Next, for simplification, this proportional coefficient is set to 1 to express the output voltage V1 as follows.

$$V1 = \Delta R1 + \Delta R3 \quad (56)$$

Next, the output voltage V2 of the resistance detection circuit 322 in the phase 2 is given as follows (see FIG. 20B).

$$V2 = \frac{-(r3 - r2) \cdot Rref}{(r3 + Rref) \cdot (r2 + Rref)} \cdot V \quad \text{(Expression 21)}$$

This can be arranged in an equation that becomes extremely complex expression. However, it is assumed that R3 and R2 are equal, and in addition, as described above, it is also assumed that ΔR1 and ΔR3 are extremely smaller than R1, R3, and Rref. By such assumptions, the Expression 21 enables the output voltage V2 to be expressed by the following primary expression to be similar to the case of the phase 1.

$$V2 = A2 - B2 \cdot (\Delta R3 - \Delta R2) \quad (57)$$

That is, the output voltage V2 of the resistance detection circuit 322 can be obtained by measuring the voltage depending on the difference (i.e., a result of subtraction) of the variations ΔR3 and ΔR2 of the resistance values of the resistors r3 and r2 of the resistance type sensors 31-3 and 31-32. Likewise, the values of A2 and B2 can be arbitrarily set and the equation (57) can be further simplified and given as follows.

$$V2 = \Delta R3 - \Delta R2 \quad (58)$$

The resistance detection circuit 322 (see FIG. 20C) in the subsequent phase 3 is similar to the resistance detection circuit 321 in the phase 1. Moreover, the resistance detection circuit 324 (see FIG. 20D) in the phase 4 is similar to the resistance detection circuit 322 in the phase 2.

Therefore, the output voltages V1 to V4, output from the resistance detection circuit 321 for respective phases, are summarized as follows.

$$V1 = \Delta R1 + \Delta R3 \quad (59)$$

$$V2 = \Delta R3 - \Delta R2 \quad (60)$$

$$V3 = \Delta R2 + \Delta R4 \quad (61)$$

$$V4 = -\Delta R4 + \Delta R1 \quad (62)$$

That is, the detection circuit forming unit 32 selects two predetermined resistance sensors from four resistance type sensors 31-1 to 31-4 for each phase. Moreover, for the purpose of performing adding or subtracting operations for resistance changes of the selected resistance type sensors, the resistance detection circuits 321 to 324 are formed of either the half-bridge circuit or the full-bridge circuit.

Also, while the detection circuit forming unit 32 has been described heretofore to be formed of the bridge circuits, any circuit capable of converting resistance changes of two or more resistance type sensors into voltages may be applicable. For example, even a current voltage converter circuit, in which fixed current flows through the resistance type sensor, is capable of converting the resistance into voltage, and a resistance ladder circuit well utilized as a DA (Digital to Analog) converter may be applicable.

The detection circuit forming unit 32 may preferably include a circuit that can convert a sum of or a difference of the resistance changes of two or more resistance type sensors into a sum of or a difference of voltages.

In case of embodiment 4, in some cases, a subtraction result between mutual resistance values is converted into a voltage value. Hence, the full-bridge circuit is particularly most suited in light of the cost and accuracy.

In addition, the detection circuit forming unit 32 may preferably have a transistor and an amplifier present at a subsequent stage.

The measuring unit 33 sequentially acquires and measures the output voltages V1 to V4 output from the resistance type sensors 321 to 324 are formed of the detection circuit forming unit 32. Specifically, a predetermined signal process such as amplification or AD conversion is performed for the acquired output voltages V1 to V4.

To this end, the measuring unit 33 includes, for example, amplifying circuits (not illustrated), which include computing amplifiers (operation amplifiers) for amplifying the output voltages V1 to V4 output from the resistance detection circuits 321 to 324, and AD converters (not illustrated) for performing AD conversions of the outputs of the amplifying circuits, respectively.

The computing unit 34 linearly combines the output voltages V1 to V4 acquired and output by the measuring unit 33, after output from the detection circuit forming unit 32, by performing a predetermined computation. Based on such linear combination, the computing unit 34 performs computations to obtain the outputs on respective axes (supposed to be X-axis, Y-axis, and Z-axis) and computation results are output.

Here, as described above, the measuring unit 33 acquires the output voltages V1 to V4 from the detection circuit forming unit 32 and allows the AD conversion circuits to perform AD conversions to output digital signals. To this end, computations of the computing unit 34 for the outputs on the respective axes can be achieved by a CPU (Central Processing Unit) or software of a microcomputer.

Concrete Example 1

Next, a concrete example of embodiment 4 according to the present invention will be described.

First, Concrete example 1 is described.

Concrete example 1 is a case where in embodiment 4 illustrated in FIG. 19, magnetic resistance type sensors having the following output characteristics are applied as the resistance type sensors 31-1 to 31-4.

$$\Delta R1 = X + Z = kx \cdot Bx + kz \cdot Bz \quad (63)$$

$$\Delta R2 = X - Z = kx \cdot Bx - kz \cdot Bz \quad (64)$$

$$\Delta R3 = Y + Z = ky \cdot By + kz \cdot Bz \quad (65)$$

$$\Delta R4 = Y - Z = ky \cdot By - kz \cdot Bz \quad (66)$$

Here, Bx, By, and Bz represent respective axis component values of 3-axis (X-axis, Y-axis, and Z-axis) magnetic fields orthogonal to each other. Moreover, kx, ky, and kz correspond to sensitivities of the sensors in general, and in this example, indicate transformation constants from the magnetic fields to the resistance values. Accordingly, X, Y, and Z represent the component values of the respective magnetic fields in terms of dimensions of resistances.

In addition, the magnetic resistance type sensors, having the output characteristics indicated by the equations (63) to (66), have concrete internal configurations that are known in the art as disclosed in JP 2002-71381 A or the like.

A study will be conducted as to a case where the time-sharing process is sequentially performed on the sensors, each having the characteristics described above, in an order of a first magnetic resistance type sensor, a second magnetic resistance type sensor, . . . , and so on. To describe in detail, this is given as follows.

$$\text{Phase } 1 = V1(\text{Time sharing}) = \Delta R1 = X + Z \quad (67)$$

$$\text{Phase } 2 = V2(\text{Time sharing}) = \Delta R2 = X - Z \quad (68)$$

$$\text{Phase } 3 = V3(\text{Time sharing}) = \Delta R3 = Y + Z \quad (69)$$

$$\text{Phase } 4 = V4(\text{Time sharing}) = \Delta R4 = Y - Z \quad (70)$$

In such signal processing, it becomes possible to measure all of quantities on left sides of the above equations (67) to (70). Thus, by using the results, the component values X, Y, and Z of the magnetic fields on respective axes are obtainable in the following equations.

$$X\text{-axis Magnetic Field: } X = \tfrac{1}{2} \cdot (V1(\text{Time sharing}) + V2(\text{Time sharing})) \quad (71)$$

$$Y\text{-axis Magnetic Field: } Y = \tfrac{1}{2} \cdot (V3(\text{Time sharing}) + V4(\text{Time sharing})) \quad (72)$$

$$Z\text{-axis Magnetic Field: } Z = \tfrac{1}{4} \cdot (V1(\text{Time sharing}) - V2(\text{Time sharing})) + V3(\text{Time sharing}) - V4(\text{Time sharing}) \quad (73)$$

In contrast, in Concrete example 1 according to embodiment 4, the detection circuit forming unit 32 forms the resistance detection circuits 321 to 324 as illustrated in FIG. 20A to FIG. 20D, in order of time. The measuring unit 33 measures the output voltages V1 to V4 of the resistance detection circuits 321 to 324 in synchronization with respective orders of time. As a result, the output voltages V1 to V4 of the detection circuit forming unit 32 in the respective phases are derived from the equations (59) to (62), as follows.

$$\text{Phase } 1: V1 = \Delta R1 + \Delta R3 = X + Y + 2Z \quad (74)$$

$$\text{Phase } 2: V2 = \Delta R3 - \Delta R2 = -X + Y + 2Z \quad (75)$$

$$\text{Phase } 3: V3 = \Delta R2 + \Delta R4 = X + Y - 2Z \quad (76)$$

$$\text{Phase } 4: V4 = -\Delta R4 + \Delta R1 = X - Y + 2Z \quad (77)$$

By inversely solving these relational expressions, the computing unit 34 can compute the component values X, Y, and Z of the magnetic fields on the respective axes by using the output voltages V1 to V4 on the left sides of the equations (74) to (77).

In particular, such computations are performed as follows.

$$X\text{-axis Magnetic Field: } X = \tfrac{1}{4} \cdot (V1 - V2 + V3 + V4) \quad (78)$$

$$Y\text{-axis Magnetic Field: } Y = \tfrac{1}{4} \cdot (V1 + V2 + V3 - V4) \quad (79)$$

$$Z\text{-axis Magnetic Field: } Z = \tfrac{1}{8} \cdot (V1 + V2 - V3 + V4) \quad (80)$$

As will be apparent from the foregoing description, Bx, By, Bz to X, Y, Z may not necessarily be the component values of the 3-axe magnetic fields, and original physical quantities are not limited to the magnetic fields, as long as the sensors satisfy the equations (63) to (66) with respect to the four resistance type sensors.

Further, the resistance detection circuits 321 to 324 in respective phases of FIG. 20A to FIG. 20D are not the one and only configurations. As a first example, no compatibility between the respective phases lose generality. As a second example, even when the resistances r1 to r4 related to the resistance type sensors 31-1 to 31-4, respectively, are replaced with the reference resistance Rref in all of the four phases, an exactly similar result can be obtained. Likewise, even when the resistance type sensors to be selected between the respective phases are replaced with each other, the equations (74) to (77) can be satisfied.

More specifically, the resistance detection circuits for converting the resistance into the voltage are not limited to the bridge circuits. Any type of resistance detection circuit that can satisfy the relationships of the equations (78) to (80) may be applicable to the device according to the present invention.

Incidentally, the above equations (74) to (77) are very similar to Expression 9 disclosed in WO 2008/032741. Expression 9 is cited as follows, without change.

$$(\alpha) = A + C = Hx + Hy + 2\ Hz + \sqrt{2}n \quad (81)$$

$$(\beta) = A + D = Hx - Hy + 2\ Hz + \sqrt{2}n \quad (82)$$

$$(\gamma) = B + D = -Hx - Hy + 2\ Hz + \sqrt{2}n \quad (83)$$

$$(\delta) = B + C = -Hx + Hy + 2\ Hz + \sqrt{2}n \quad (84)$$

In the above expressions, the equation (74) and the equation (81) are similar to (α) (except for noise n). The equation (75) and the equation (76) are similar to those in which the equation (82) and the equation (84) are inversed. Substitution between the equation (75) and the equation (76) can be arbitrary, as described above, and all of essential meanings are similar.

Meanwhile, the equation (76) and the equation (83) have different signs. Such a difference in sign comes from a difference in that a magnetic resistance type sensor, as disclosed in the Patent document described above, is used for a technical object of the present invention. That is, this is an inevitable difference. However, since the sign can be inverted in the invention disclosed in WO 2008/032741, the definition of (γ) as expressed below again allows the equation (76) and the equation (83) to be similar.

$$(\gamma) = -B - D \quad (85)$$

Next, a study will be conducted as to what extent the SN ratio is improved in Concrete example 1 of embodiment 4.

To this end, signal components and noise components for the respective phases in the case of the time-sharing process that is a comparison object of Concrete example 1 are defined as follows.

$$\text{Phase 1} = V1(\text{Time sharing}) = \Delta R1 = X + Z \pm Ns \pm Na \quad (86)$$

$$\text{Phase 2} = V2(\text{Time sharing}) = \Delta R2 = X - Z \pm Ns \pm Na \quad (87)$$

$$\text{Phase 3} = V3(\text{Time sharing}) = \Delta R3 = Y + Z \pm Ns \pm Na \quad (88)$$

$$\text{Phase 4} = V4(\text{Time sharing}) = \Delta R4 = Y - Z \pm Ns \pm Na \quad (89)$$

Here, a first sign in each equation is derived from the time-sharing process. A second sign is led from the equations (83) to (66). Moreover, it is supposed that ±Ns designates noise resulting from the resistance type sensor in each phase, and ±Na designates noise occurring at the measuring unit 33 in each phase. In addition, it is supposed that both of these noises take what is called white noise, that is, a fixed value for all frequency bands with respective noises remaining uncorrelated to each other.

To acquire a magnetic field on each axis, when applying the equations (71) to (73) to the output voltages including noises in respective phases indicated in the equations (86) to (89), the following expressions are obtainable.

$$X\text{-axis Magnetic Field (including noise): } X' = \tfrac{1}{2} \cdot (2X \pm \sqrt{2}Ns \pm \sqrt{2}Na) \quad (90)$$

$$Y\text{-axis Magnetic Field (including noise): } Y' = \tfrac{1}{2} \cdot (2Y \pm \sqrt{2}Ns \pm \sqrt{2}Na) \quad (91)$$

$$Z\text{-axis Magnetic Field (including noise): } Z' = \tfrac{1}{4} \cdot (4Z \pm 2Ns \pm 2Na) \quad (92)$$

Meanwhile, the signal components and the noise components for the respective phases are defined as expressed in the equations (86) to (89). When the signal processing of Concrete example 1 according to the present invention, that is, FIG. 2 and the equations (74) to (77) are applied, the signal components and the noise components in respective phases can be expressed as follows.

$$\text{Phase 1: } V1 = \Delta R1 + \Delta R3 = (X+Z\pm Ns) + (Y+Z\pm Ns) \pm Na = X+Y+2Z \pm \sqrt{2}Ns \pm Na \quad (93)$$

$$\text{Phase 2: } V2 = \Delta R3 - \Delta R2 = (Y+Z\pm Ns) - (X-Z\pm Ns) \pm Na = -X+Y+2Z \pm \sqrt{2}Ns \pm Na \quad (94)$$

$$\text{Phase 3: } V3 = \Delta R2 + \Delta R4 = (X-Z\pm Ns) + (Y-Z\pm Ns) \pm Na = X+Y-2Z \pm \sqrt{2}Ns \pm Na \quad (95)$$

$$\text{Phase 4: } V4 = -\Delta R4 + \Delta R1 = -(Y-Z\pm Ns) + (X+Z\pm Ns) \pm Na = X-Y+2Z \pm \sqrt{2}Ns \pm Na \quad (96)$$

One measuring unit 33 is provided, and hence, in the equations (93) to (96), one ±Na for each phase is added to a sum of two sensor signals including noises. In addition, since sensor noises are uncorrelated to each other, the equations (93) to (96) can be modified as second lines.

When the same computations as those for V1 to V4, described in the above equations (78) to (89), are performed for the equations (93) to (96), the magnetic fields X', Y', Z' on the respective axes including noises are computed as follows.

$$X\text{-axis Magnetic Field (with Noise): } X' = \tfrac{1}{4} \cdot (4X \pm 2\sqrt{2}Ns \pm Na) \quad (97)$$

$$Y\text{-axis Magnetic Field (with Noise): } Y' = \tfrac{1}{4} \cdot (4Y \pm 2\sqrt{2}Ns \pm Na) \quad (98)$$

$$Z\text{-axis Magnetic Field (with Noise): } Z' = \tfrac{1}{8} \cdot (8Z \pm 2\sqrt{2}Ns \pm 2Na) \quad (99)$$

When comparing the equations (97) to (99) to the equations (90) to (92), it turns out that the SN ratios vary as follows.

SN Ratio on X-axis: SN ratio for Ns is same. SN ratio for Na is improved by √2 times.

SN Ratio on Y-axis: SN ratio for Ns is same. SN ratio for Na is improved by √2 times.

SN Ratio on Z-axis: SN ratio for Ns is improved by √2 times. SN ratio for Na is improved by 2 times.

Here, noise Ns, caused by the resistance type sensor, is extremely small to be ignored and only Na caused by the measuring unit 33 is taken into consideration. Further, in consideration of the fact that the time-sharing process needs three phases and Concrete example 1 of embodiment 4 needs four phases, a total time-sharing process period for all phases (i.e., one cycle) on both is adjusted in alignment. That is, a processing period for one phase of Concrete example according to embodiment 4 is reduced to a period of ¾ times the time-sharing process.

The SN ratio for Na in this situation becomes √3/2 times the above SN ratio on all of the axes. That is, the improvements are achieved for all of the axes as expressed below.

SN Ratio on X-axis: SN ratio for Na is improved by √6/2 times (approximately 1.22 times).

SN Ratio on Y-axis: SN ratio for Na is improved by √6/2 times (approximately 1.22 times).

SN Ratio on Z-axis: SN ratio for Na is improved by √3 times (approximately 1.73 times).

Accordingly, when noise caused by the resistance type sensor is extremely small and supposed to be ignored as compared to noise resulting from the measuring unit 33, Concrete example 1 of embodiment 4 exhibits the maximum effect.

Concrete Example 2

Next, Concrete example 2 according to embodiment 4 will be described.

According to Concrete example 2, in embodiment 4 illustrated in FIG. 19, magnetic resistance type sensors having the following output characteristics are applied as the resistance type sensors 31-1 to 31-4.

$$\Delta R1 = X + Z + Yx = kx \cdot Bx + kz \cdot Bz + kyx \cdot By \quad (100)$$

$$\Delta R2 = X - Z + Yx = kx \cdot Bx - kz \cdot Bz + kyx \cdot By \quad (101)$$

$$\Delta R3 = Y + Z + Xy = ky \cdot By + kz \cdot Bz + kxy \cdot Bx \quad (102)$$

$$\Delta R4 = Y - Z + Xy = ky \cdot By - kz \cdot Bz + kxy \cdot Bx \quad (103)$$

In the equations (100) to (103), the parameters described in the equations (63) to (66) have the same meanings as those described. Newly defined kxy and kyx are what is called cross axis sensitivity, where kxy represents sensitivity given to the Y-axis resistance type sensor by the X-axis magnetic field, and kyx represents sensitivity given to the X-axis resistance type sensor by the Y-axis magnetic field.

Accordingly, Concrete example 1 of embodiment 4 described above represents a special case (i.e., a case of the absence of cross axis sensitivity) of Concrete example 2 of embodiment 4.

Moreover, a concrete internal configuration of the magnetic resistance sensor, having the output characteristics as illustrated in the equations (100) to (103), is known in the art as disclosed in JP 2002-71381 and the like.

According to Concrete example 2, in a way similar to Concrete example 1, the detection circuit forming unit 32 forms the resistance type detection circuits 321 to 324 as illustrated in FIG. 20A to FIG. 20D in time order. The measuring unit 33 measures the output voltages V1 to V4 of the resistance type detection circuits 321 to 324 in synchronization with respective time orders. As a result, the output voltages vary in respective phases for the three-axis magnetic fields as expressed as follows.

$$\text{Phase 1: } V1 = \Delta R1 + \Delta R3 = (X+Yx) + (Y+Xy) + 2Z \qquad (104)$$

$$\text{Phase 2: } V2 = \Delta R3 - \Delta R2 = -(X+Yx) + (Y+Xy) + 2Z \qquad (105)$$

$$\text{Phase 3: } V3 = \Delta R2 + \Delta R4 = (X+Yx) + (Y+Xy) - 2Z \qquad (106)$$

$$\text{Phase 4: } V4 = -\Delta R4 + \Delta R1 = (X+Yx) - (Y+Xy) + 2Z \qquad (107)$$

As apparent from the equations (100) to (103) for the output characteristics, these relational expressions merely include expressions in which X in Concrete example 1 of embodiment 4 is replaced with X+Yx and Y by Y+Xy. Accordingly, by inversely solving the equations (100) to (103), it is made possible for the computing unit 34 to compute X+Yx, Y+Xy, and Z, respectively.

To write these concretely, these are given as follows.

$$X+Yx = \tfrac{1}{4} \cdot (V1 - V2 + V3 + V4) \qquad (108)$$

$$Y+Xy = \tfrac{1}{4} \cdot (V1 + V2 + V3 - V4) \qquad (109)$$

$$Z = \tfrac{1}{8} \cdot (V1 + V2 - V3 + V4) \qquad (110)$$

As apparent from the foregoing description, Bx, By and Bz to X, Y, Z may not particularly be the magnetic component values. The original physical quantities is not limited to the magnetic fields, any sensor of satisfying the output characteristics of the equations (100) to (103) may be provided, as to the four resistance type sensors.

In view of these results of the equations (108) to (110), the Z-axis magnetic field has been already acquired by the equation (110). In practice, this is exactly the same expression as that of Concrete example 1 according to embodiment 4. That is, for the improvement of the SN ratio, the exactly same conclusion as that of Concrete example 1 is established.

Meanwhile, in order to calculate the X-axis magnetic field and the Y-axis magnetic field, by substituting the results of the equations (108) to (110) into the equations (100) to (103) to erase X, Y, Xy and Yx, the following two equations are derived.

$$V1 - V2 + V3 + V4 = 4(X+Yx) = 4(kx \cdot Bx + kyx \cdot By) = P1 \qquad (111)$$

$$V1 + V2 + V3 - V4 = 4(Y+Xy) = 4(kxy \cdot Bx + ky \cdot By) = P2 \qquad (112)$$

All left sides of these equations (111) and (112) represent quantities (P1 and P2) that are acquired upon measuring. In addition, all of kx, ky, kxy, and kyx are constants that can be obtained beforehand. Accordingly, unknown quantities in the equations (111) and (112) are only Bx and By that can be obtained.

To describe in detail with the use of P1 and P2 defined in the equations (111) and (112), the following expressions are given.

$$Bx = \frac{ky \cdot P1 - kyx \cdot P2}{kx \cdot ky - kxy \cdot kyx} \qquad \text{(Expression 22)}$$

$$By = \frac{kx \cdot P1 - kxy \cdot P2}{kx \cdot ky - kxy \cdot kyx}$$

According to Concrete example 2 of embodiment 4 described heretofore, it becomes possible to compute the magnetic field on each axis of the three axes for the magnetic resistance type sensors in which cross axis sensitivities are present.

According to embodiment 4 according to the present invention, as described above, the detection circuit forming unit 32 selects the two predetermined resistance type sensors from among the four resistance type sensors 31-1 to 31-4 in the measurement of the physical quantities. The predetermined resistance detection circuits 321 to 324 including such selected two resistance type sensors are configured.

In embodiment 4, further, the attempt has been made to perform computations including linear combination for the output voltages V1 to V2 given from the detection circuit forming unit 32, so as to acquire the outputs on the X-axis, the Y-axis, and the Z-axis.

In embodiment 4, therefore, when plural resistance detection circuits are needed, component elements are commonly used for the miniaturization of a circuit size or the like, and in addition, the improvement of the SN ratio can be achieved.

REFERENCE SIGNS LIST 1-1 to 1-4 sensor
2, 2A signal inverting unit
2-1 to 2-4 switch
3 combination unit
4 measuring unit
4-1 amplifying unit
4-2 AD converting unit
5 computing unit
11-1 to 11-3 acceleration sensor
11-4 to 11-6 magnetic sensor
11-7 to 11-10 sensor
12 signal amplifying unit
12-1 to 12-4 signal amplifying circuit
13-1 to 13-10 switch
14 combination unit
15 measuring unit
16 computing unit
21-1 to 21-n sensor
22, 22A signal inverting unit
22-1 to 22-n amplifying switch
22-1a to 22-na switch group
22-A amplifier
23 combination unit
24 measuring unit
25 computing unit
31-1 to 31-4 resistance type sensor
32 detection circuit forming unit
33 measuring unit
34 computing unit
321 to 324 resistance detection circuit

The invention claimed is:

1. A signal processing device comprising:
a plurality of resistance type sensors configured to detect predetermined physical quantities, and having resistances varying depending on the physical quantities;
a detection circuit forming unit configured to select two or more predetermined resistance type sensors different for each time period from the plurality of resistance type sensors, and to form a predetermined resistance detection circuit including the two or more resistance type sensors that have been selected;
a measuring unit configured to sequentially receive output signals from the resistance detection circuit that has been formed; and
a computing unit configured to carry out an operation of linearly combining the output signals sequentially output from the measuring unit to compute the physical quantities,
wherein the detection circuit forming unit is configured to form a circuit configured to convert output signals of the two or more predetermined resistance type sensors that has been selected into a voltage signal, and
wherein the two or more resistance type sensors that have been selected are sensors that simultaneously detect either physical quantities of two or more axes orthogonal to each other or two or more types of physical quantities and change resistances depending on detected values.

2. The signal processing device according to claim 1, wherein the detection circuit forming unit forms the predetermined resistance detection circuit a number of times equal to or larger than the number of the plurality of resistance type sensors, and
wherein the predetermined resistance detection circuit sequentially outputs signals that are different from each other.

3. The signal processing device according to claim 2, wherein the plurality of resistance type sensors include three or more resistance type sensors.

4. The signal processing device according to claim 1, wherein the detection circuit forming unit selects two or more resistance type sensors that detect predetermined physical quantities independent from each other from the plurality of resistance type sensors, and forms the predetermined resistance detection circuit including the two or more resistance type sensors that have been selected.

5. The signal processing device according to claim 1, wherein the computing unit computes components of the predetermined physical quantities on either two axes orthogonal to each other or three axes.

6. The signal processing device according to claim 1, wherein the predetermined physical quantities are magnetic fields.

7. The signal processing device according to claim 1, wherein the resistance detection circuits are made of either half-bridge circuits or full-bridge circuits, and
wherein the detection circuit forming unit alternately forms the half-bridge circuits and the full-bridge circuits.

8. The signal processing device according to claim 1, wherein the computing unit linearly combines the output signals from the resistance detection circuits sequentially received by the measuring unit and coefficients corresponding to the output signals from the resistance detection circuits to generate linearly combined data.

9. The signal processing device according to claim 7, wherein
the detection circuit forming unit includes a resistive element with no variations in resistance values due to the physical quantities, a power supply terminal, a ground terminal, and a plurality of switches, and
the resistance detection circuit is formed by connecting the two or more resistance type sensors that has been selected, the resistive element, the power supply terminal, and the ground terminal by the plurality of switches.

10. A signal processing device comprising:
a plurality of resistance type sensors configured to detect predetermined physical quantities, and having resistances varying depending on the physical quantities;
a detection circuit forming unit configured to select two or more predetermined resistance type sensors different for each time period from the plurality of resistance type sensors, and to form a predetermined resistance detection circuit including the two or more resistance type sensors that have been selected;
a measuring unit configured to sequentially receive output signals from the resistance detection circuit that has been formed; and
a computing unit configured to carry out an operation of linearly combining the output signals sequentially output from the measuring unit to compute the physical quantities,
wherein the plurality of resistance type sensors includes four resistance type sensors,
wherein the four resistance type sensors have output characteristics of satisfying $\Delta R1=X+Z$, $\Delta R2=X-Z$, $\Delta R3=Y+Z$, and $\Delta R4=Y-Z$, where X, Y, and Z are the physical quantities of three axes perpendicular to one another and $\Delta R1$, $\Delta R2$, $\Delta R3$, and $\Delta R4$ are change amounts output from the four resistance type sensors, and
wherein the detection circuit forming unit forms four resistance detection circuits satisfying $V1=\Delta R1+\Delta R3$, $V2=\Delta R3-\Delta R2$, $V3=\Delta R2+\Delta R4$, and $V4=-\Delta R4+\Delta R1$, where V1, V2, V3, and V4 are outputs from the four resistance detection circuits.

* * * * *